(12) United States Patent
Yamazaki et al.

(10) Patent No.: US 8,174,029 B2
(45) Date of Patent: May 8, 2012

(54) LIGHT EMITTING APPARATUS AND METHOD FOR MANUFACTURING THE SAME

(75) Inventors: Shunpei Yamazaki, Tokyo (JP); Satoshi Murakami, Kanagawa (JP); Masayuki Sakakura, Kanagawa (JP); Toru Takayama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/082,104

(22) Filed: Apr. 7, 2011

(65) Prior Publication Data

US 2011/0180801 A1    Jul. 28, 2011

Related U.S. Application Data

(60) Continuation of application No. 12/762,469, filed on Apr. 19, 2010, now Pat. No. 7,939,835, and a continuation of application No. 12/244,984, filed on Oct. 3, 2008, now Pat. No. 7,709,846, and a continuation of application No. 11/224,100, filed on Sep. 13, 2005, now Pat. No. 7,442,963, and a division of application No. 10/289,261, filed on Nov. 7, 2002, now Pat. No. 7,042,024.

(30) Foreign Application Priority Data

Nov. 9, 2001    (JP) ................................ 2001-345430
May 17, 2002   (JP) ................................ 2002-143802

(51) Int. Cl.
H01L 27/15    (2006.01)
H01L 29/26    (2006.01)
H01L 31/12    (2006.01)
H01L 33/00    (2010.01)
(52) U.S. Cl. .......................................... 257/79; 257/432
(58) Field of Classification Search .................... 257/81, 257/79, 99, 491, 432, 433, 457, 635, 640, 257/642, 649
See application file for complete search history.

(56) References Cited

U.S. PATENT DOCUMENTS 4,717,602 A    1/1988    Yamazaki
(Continued)

FOREIGN PATENT DOCUMENTS

EP    0 717 439 A2    6/1996
(Continued)

OTHER PUBLICATIONS

Baldo et al., "*Highly Efficient Phosphorescent Emission From Organic Electroluminescent Devices*", Nature, vol. 395, Sep. 10, 1998, pp. 151-154.

(Continued)

*Primary Examiner* — Sheila V Clark
(74) *Attorney, Agent, or Firm* — Nixon Peabody LLP; Jeffrey L. Costellia

(57) ABSTRACT

The purpose of the invention is to improve reliability of a light emitting apparatus comprising TFTs and organic light emitting elements. The light emitting apparatus according to the invention having thin film transistors and light emitting elements, comprises; a second inorganic insulation layer on a gate electrode, a first organic insulation layer on the second inorganic insulation layer, a third inorganic insulation layer on the first organic insulation layer, an anode layer formed on the third inorganic insulation layer, a second organic insulation layer overlapping with the end of the anode layer and having an inclination angle of 35 to 45 degrees, a fourth inorganic insulation layer formed on the upper surface and side surface of the second organic insulation layer and having an opening over the anode layer, an organic compound layer formed in contact with the anode layer and the fourth inorganic insulation layer and containing light emitting material, and a cathode layer formed in contact with the organic compound layer containing the light emitting material, wherein the third inorganic insulation layer and the fourth inorganic insulation layer are formed with silicon nitride or aluminum nitride.

22 Claims, 29 Drawing Sheets

U.S. PATENT DOCUMENTS

| | | |
|---|---|---|
| 5,550,066 A | 8/1996 | Tang et al. |
| 5,550,091 A | 8/1996 | Fukuda et al. |
| 5,701,055 A | 12/1997 | Nagayama et al. |
| 5,789,766 A | 8/1998 | Huang et al. |
| 5,882,761 A | 3/1999 | Kawami et al. |
| 5,929,474 A | 7/1999 | Huang et al. |
| 5,952,037 A | 9/1999 | Nagayama et al. |
| 5,952,708 A | 9/1999 | Yamazaki |
| 5,978,403 A | 11/1999 | Iwasa et al. |
| 6,013,538 A | 1/2000 | Burrows et al. |
| 6,016,033 A | 1/2000 | Jones et al. |
| 6,037,712 A | 3/2000 | Codama et al. |
| 6,057,647 A | 5/2000 | Kurosawa et al. |
| 6,069,443 A | 5/2000 | Jones et al. |
| 6,115,090 A | 9/2000 | Yamazaki |
| 6,169,293 B1 | 1/2001 | Yamazaki |
| 6,194,837 B1 * | 2/2001 | Ozawa .................. 315/169.1 |
| 6,198,217 B1 * | 3/2001 | Suzuki et al. ............. 313/504 |
| 6,239,470 B1 | 5/2001 | Yamazaki |
| 6,274,887 B1 | 8/2001 | Yamazaki et al. |
| 6,277,507 B1 | 8/2001 | Anzaki et al. |
| 6,297,516 B1 | 10/2001 | Forrest et al. |
| 6,310,670 B1 | 10/2001 | Lee |
| 6,331,356 B1 | 12/2001 | Angelopoulos et al. |
| 6,373,187 B1 | 4/2002 | Nagayama et al. |
| 6,426,245 B1 | 7/2002 | Kawasaki et al. |
| 6,429,584 B2 | 8/2002 | Kubota |
| 6,441,873 B2 | 8/2002 | Young |
| 6,445,005 B1 | 9/2002 | Yamazaki et al. |
| 6,476,988 B1 | 11/2002 | Yudasaka |
| 6,501,227 B1 | 12/2002 | Koyama |
| 6,512,504 B1 | 1/2003 | Yamauchi et al. |
| 6,524,877 B1 * | 2/2003 | Nakazawa et al. ............. 438/48 |
| 6,538,390 B2 | 3/2003 | Fujita et al. |
| 6,549,259 B2 | 4/2003 | Sato et al. |
| 6,555,840 B1 | 4/2003 | Hudson et al. |
| 6,570,639 B1 | 5/2003 | Manabe et al. |
| 6,590,227 B2 * | 7/2003 | Ishikawa ..................... 257/68 |
| 6,590,337 B1 | 7/2003 | Nishikawa et al. |
| 6,593,691 B2 | 7/2003 | Nishi et al. |
| 6,593,990 B1 | 7/2003 | Yamazaki |
| 6,602,771 B2 | 8/2003 | Inoue et al. |
| 6,605,826 B2 | 8/2003 | Yamazaki et al. |
| 6,608,620 B1 | 8/2003 | Suzuki et al. |
| 6,667,791 B2 | 12/2003 | Sanford et al. |
| 6,689,492 B1 | 2/2004 | Yamazaki et al. |
| 6,724,150 B2 | 4/2004 | Maruyama et al. |
| 6,767,796 B2 | 7/2004 | Tanaka et al. |
| 6,774,574 B1 | 8/2004 | Koyama |
| 6,777,887 B2 | 8/2004 | Koyama |
| 6,781,152 B2 | 8/2004 | Yamazaki |
| 6,822,264 B2 | 11/2004 | Yamazaki et al. |
| 6,879,309 B2 | 4/2005 | Yamauchi et al. |
| 6,894,312 B2 | 5/2005 | Yamazaki et al. |
| 6,903,377 B2 | 6/2005 | Yamazaki et al. |
| 6,958,740 B1 | 10/2005 | Nishikawa |
| 6,998,644 B1 | 2/2006 | Boling et al. |
| 7,030,847 B2 | 4/2006 | Kimura |
| 7,041,584 B2 | 5/2006 | Tanaka et al. |
| 7,042,024 B2 | 5/2006 | Yamazaki et al. |
| 7,119,364 B2 | 10/2006 | Yamazaki |
| 7,126,161 B2 | 10/2006 | Yamazaki |
| 7,129,523 B2 | 10/2006 | Yamazaki et al. |
| 7,147,530 B2 | 12/2006 | Yamazaki et al. |
| 7,178,927 B2 | 2/2007 | Seo |
| 7,190,114 B2 | 3/2007 | Yamagata et al. |
| 7,274,349 B2 | 9/2007 | Yamauchi et al. |
| 7,358,531 B2 | 4/2008 | Koyama |
| 7,544,264 B2 | 6/2009 | Tateishi |
| 2001/0002144 A1 | 5/2001 | Yamazaki |
| 2002/0000551 A1 | 1/2002 | Yamazaki et al. |
| 2002/0038998 A1 | 4/2002 | Fujita et al. |
| 2002/0056842 A1 | 5/2002 | Yamazaki |
| 2002/0070663 A1 | 6/2002 | Ogura et al. |
| 2002/0180371 A1 | 12/2002 | Yamazaki et al. |
| 2002/0190256 A1 | 12/2002 | Murakami et al. |
| 2003/0089913 A1 | 5/2003 | Takayama et al. |
| 2003/0129790 A1 | 7/2003 | Yamazaki et al. |
| 2003/0155573 A1 | 8/2003 | Yamazaki et al. |
| 2003/0170423 A1 | 9/2003 | Katsumoto et al. |
| 2004/0003939 A1 | 1/2004 | Nishi et al. |
| 2005/0162092 A1 | 7/2005 | Yamazaki et al. |
| 2005/0224820 A1 | 10/2005 | Yamazaki et al. |
| 2006/0286889 A1 | 12/2006 | Nishi et al. |
| 2007/0012921 A1 | 1/2007 | Yamazaki |
| 2007/0034875 A1 | 2/2007 | Yamazaki et al. |
| 2007/0040492 A1 | 2/2007 | Nakamura |
| 2007/0063646 A1 | 3/2007 | Yamazaki et al. |
| 2007/0082430 A1 | 4/2007 | Yamazaki |
| 2008/0018566 A1 | 1/2008 | Yamauchi et al. |
| 2008/0203909 A1 | 8/2008 | Azuma |
| 2009/0015146 A1 | 1/2009 | Tanaka et al. |
| 2009/0101904 A1 | 4/2009 | Yamamoto et al. |
| 2009/0115688 A1 | 5/2009 | Adachi et al. |
| 2009/0149224 A1 | 6/2009 | Yamazaki et al. |
| 2009/0224261 A1 | 9/2009 | Takahashi et al. |

FOREIGN PATENT DOCUMENTS

| | | |
|---|---|---|
| EP | 0 732 868 A1 | 9/1996 |
| EP | 0 776 147 A1 | 5/1997 |
| EP | 1 049 176 A2 | 11/2000 |
| EP | 1 058 314 A2 | 12/2000 |
| EP | 1 058 484 A1 | 12/2000 |
| EP | 1 063 630 A2 | 12/2000 |
| EP | 1 109 225 A2 | 6/2001 |
| EP | 1 122 794 A2 | 8/2001 |
| JP | 07-076776 | 3/1995 |
| JP | 07-278805 | 10/1995 |
| JP | 08-241047 | 9/1996 |
| JP | 08-315981 | 11/1996 |
| JP | 10-173196 | 6/1998 |
| JP | 10-268360 | 10/1998 |
| JP | 10-321372 | 12/1998 |
| JP | 2000-026139 | 1/2000 |
| JP | 2000-331784 | 11/2000 |
| JP | 2001-005426 | 1/2001 |
| JP | 2001-013893 | 1/2001 |
| JP | 2001-052873 | 2/2001 |
| JP | 2001-077374 | 3/2001 |
| JP | 2001-228485 | 8/2001 |
| JP | 2001-236027 | 8/2001 |
| JP | 2001-284041 | 10/2001 |
| JP | 2001-290439 | 10/2001 |
| JP | 2002-118078 | 4/2002 |

OTHER PUBLICATIONS

Baldo et al. "*Very High-Efficiency Green Organic Light-Emitting Devices Based on Electrophosphorescence*" Applied Physics Letters, vol. 75, No. 1, Jul. 5, 1999, pp. 4-6.

Tsutsui et al., "*Electroluminescence in Organic Thin Films*", Photochemical Processes in Organized Molecular Systems, Sep. 22, 1991, pp. 437-450.

Tsutsui et al., "*High Quantum Efficiency in Organic Light-emitting Devices With Iridium-Complex as a Triplet Emissive Center*", Japanese Journal of Applied Physics, vol. 38/Part. 2, Dec. 15, 1999, No. 12B, pp. L1502-L1504.

* cited by examiner

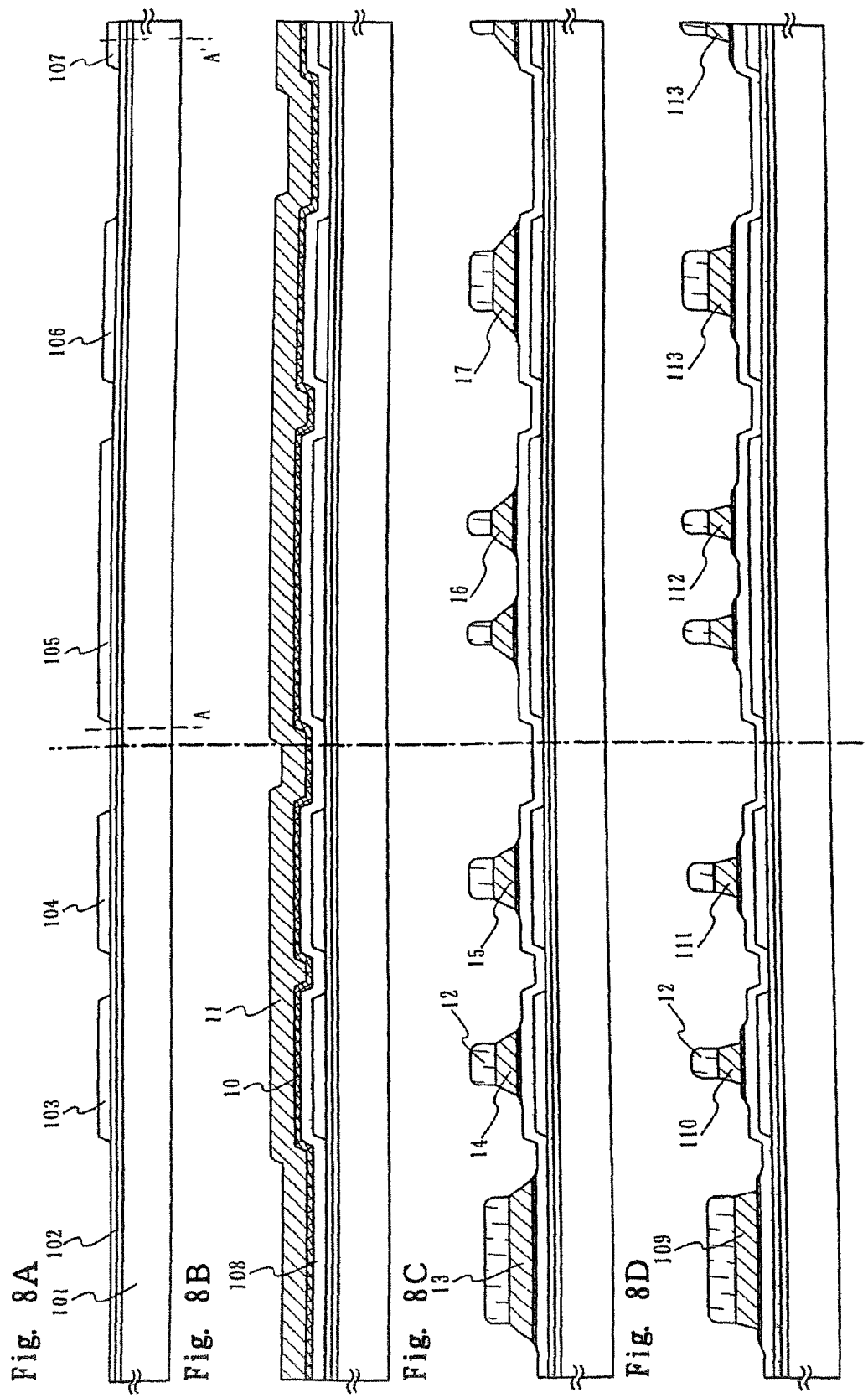

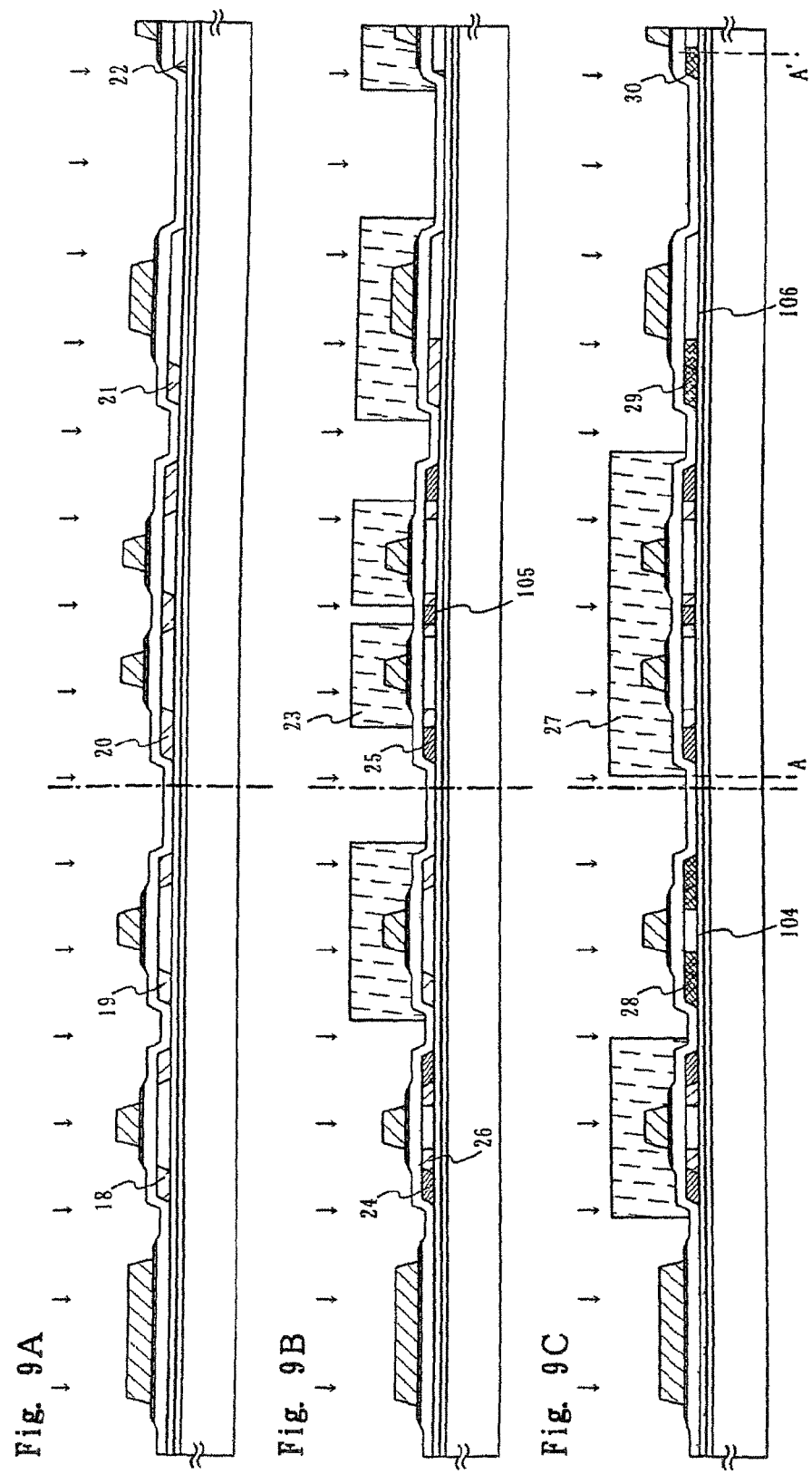

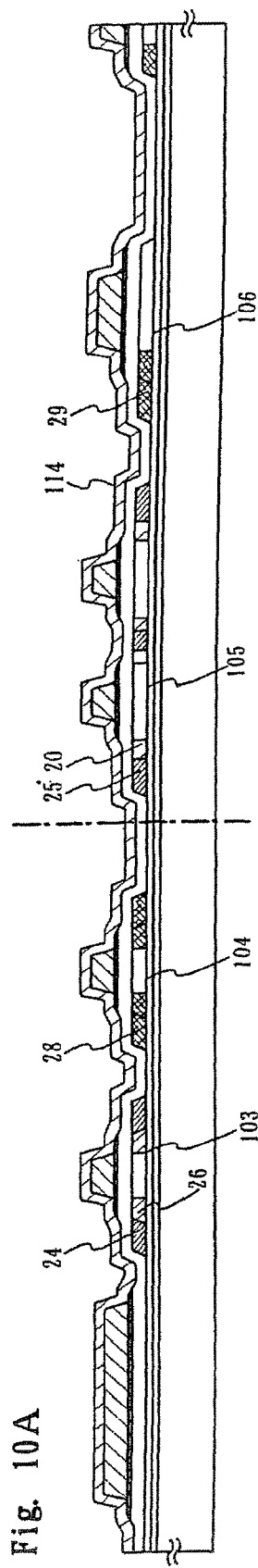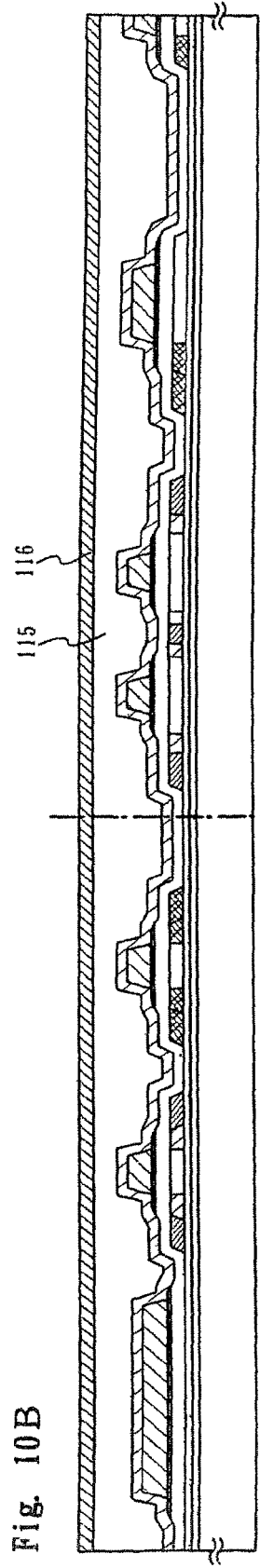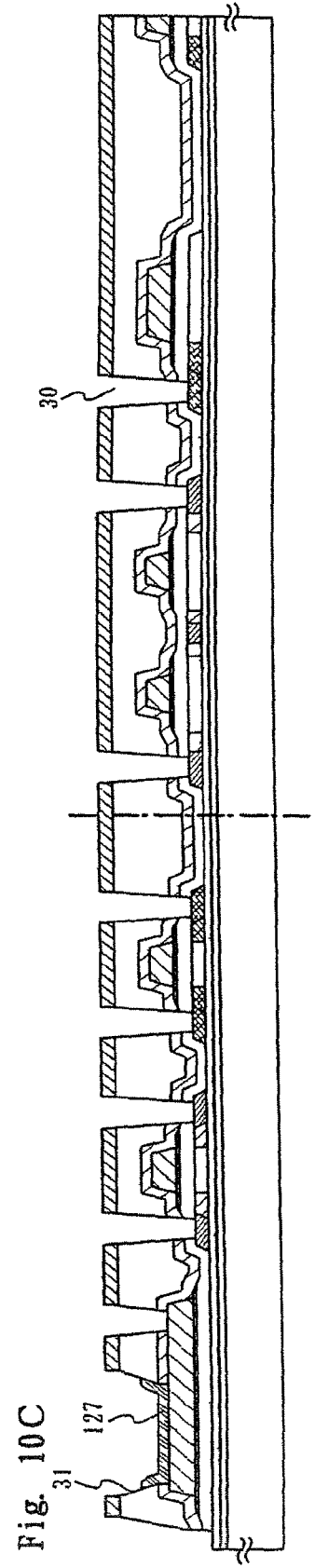

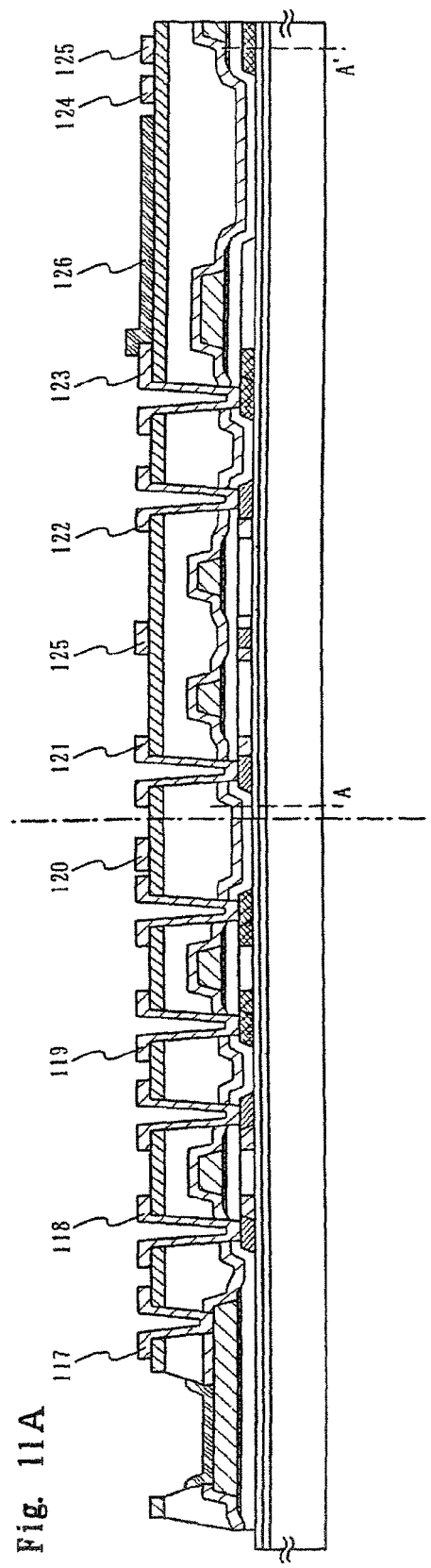
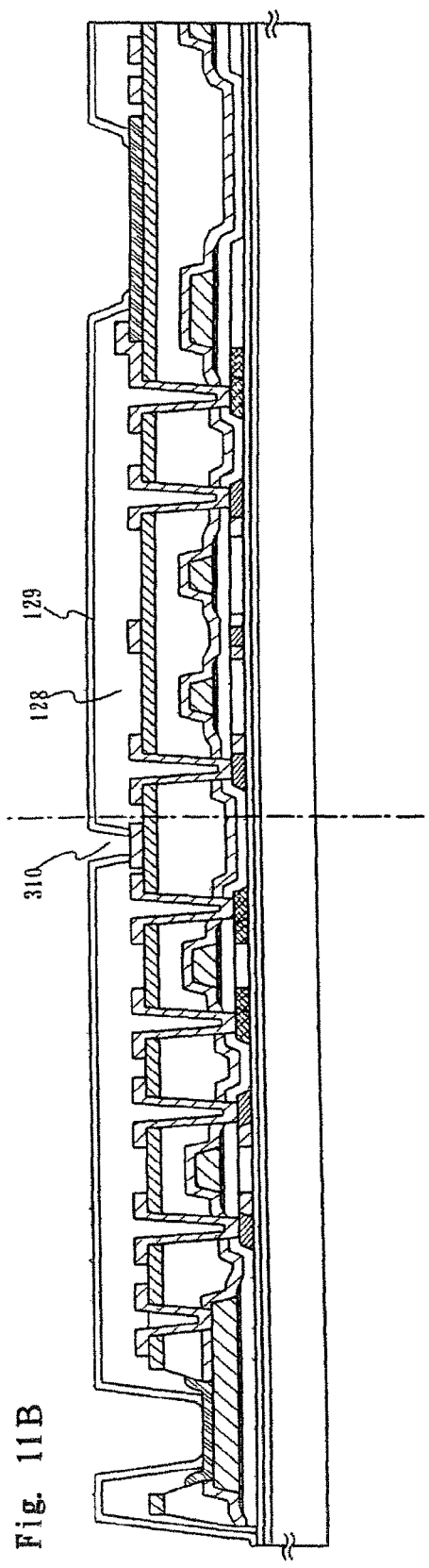
Fig. 11A
Fig. 11B

※sputtering condition refers to Table. 1

※Processing condition follows Table 1 and 2.

C-V characteristics of MOS structure in case that there is a source of Li diffusion BT stress test condition:
150°C, 1.7MV/cm
1hr C-V characteristics of MOS structure in case that there is not a source of Li diffusion C-V characteristics of MOS structure in case that there is not a source of Li diffusion

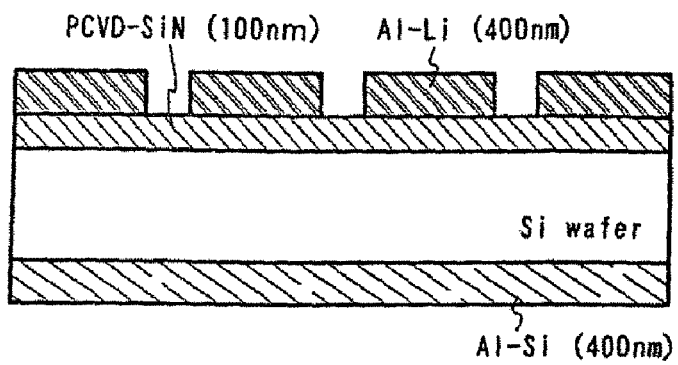
Fig. 29A MOS structure comprising PCVD-SiN film
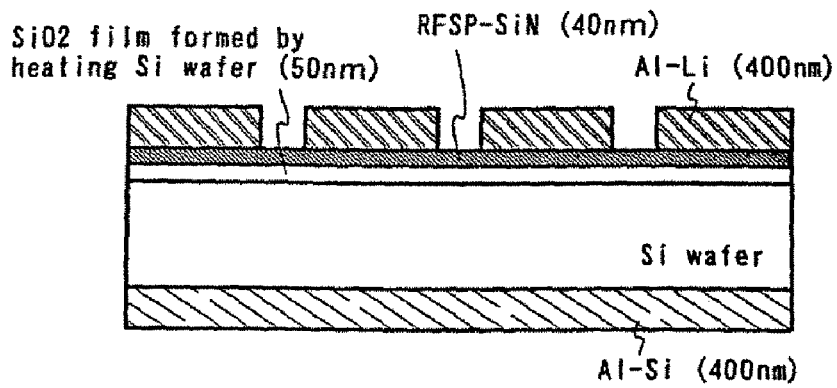
Fig. 29B MOS structure comprising RFSP-SiN film

LIGHT EMITTING APPARATUS AND METHOD FOR MANUFACTURING THE SAME

BACKGROUND OF THE INVENTION

1. Field of the Invention

The present invention relates to a light emitting apparatus comprising a light emitting element which emits fluorescent light or phosphorescent light. In particular, the invention relates to a light emitting apparatus comprising an active element such as insulation gate type transistor or a TFT, and a light emitting element coupled thereto.

2. Description of the Related Art

A typical display apparatus utilizing liquid crystal uses a back light or a front light for displaying images. A liquid crystal display apparatus is employed as an image displaying unit in various electronics, but suffers a structural problem that it has a narrow angled field of view. On the contrary, a display which uses light emitting elements providing electro-luminescence as a display unit has a wider-angled field of view as well as high level of visual recognition. These advantages make the electro-luminescent display prospective for the next generation.

A light emitting mechanism utilizing the electro-luminescence is considered as a phenomenon in which electrons injected from a cathode and positive holes injected from an anode couple on a layer comprising light emitting material to form excitons and a Light is released when the excitons move back to the ground state. There are two types of electro-luminescence, i.e., fluorescent light and phosphorescent light, each of which is considered as light emitted from the excitons in a singlet state (fluorescent light), and light emitted from the excitons in a triplet state (phosphorescent light), respectively. The luminance from electro-luminescence ranges from thousands $cd/m^2$ to tens of thousands $cd/m^2$, which makes it possible in principle to adopt the electro-luminescence light emitting elements in a variety of applications including a display apparatus.

An example of a combination of a Thin Film Transistor (hereinafter referred to as "TFT") and a light emitting element is disclosed in the Japanese Patent Laid-Open No. JP-A-8-241047. In the construction disclosed in this JP-A-8-241047, an organic electro-luminescence layer is formed on a TFT comprising polycrystalline silicon, via an insulation film comprising silicon dioxide. A passivasion layer having a tapered end on the anode is positioned under the organic electro-luminescence layer. The cathode is made from a material with a work function of 4 eV or less. An example of an applicable material is an alloy of metal such as silver or aluminum, and magnesium.

Known methods for manufacturing the organic electro-luminescence layer include vacuum evaporation, printing, and spin coating. However, it is difficult to form determined patterns on the organic electro-luminescence layer by photolithography technique as used in the semiconductor element manufacturing. In order to arrange the light emitting elements in a matrix to make a display screen, a special construction is necessary in which each pixel is partitioned with insulation material, as disclosed in the above JP-A-8-241047.

In the first place, It was pointed out as a problem that an organic compound used for the light emitting elements, and an alkali metal or an alkali earth metal used for an electrode are degraded by reactions with water and oxygen.

The organic light emitting element deteriorates due to following six factors; (1) change in the chemical characteristics of the organic compound (2) fusion of the organic compounds by heat generated at operating, (3) destruction of insulation due to macro-level defect, (4) deterioration of the interface between the electrodes, or between the electrode and the organic compound layer comprising the light emitting element, (5) deterioration caused by instability in the amorphous structure of organic compounds, and (6) irreversible destruction caused by stress or distortion due to the structure of the elements.

The deterioration by the factor (1) is caused by chemical change incurred by excitation, or gas which are corrosive against the organic compounds or moisture. The deterioration by the factor (2) and (3) is caused by the operation of the organic light emitting element. Heat is inevitably generated when current flowing in the element is converted into Joule heat. When the organic compound has low melting point or glass transition temperature, the electric field concentrates around pinholes or cracks and dielectric breakdown occur. The deterioration by the factors (4) and (5) is inevitable even when the element is stored at ambient temperature. The deterioration by the factor (4) is known as dark spots, which are generated by the oxidation of the cathode or the reaction to moisture. For deterioration by the factor (5), all the organic compounds used in the organic light emitting element are amorphous, so that they will be inevitably crystallized in a long period, and heat. Almost no organic compound can keep its amorphous structure for a long time. For deterioration by the factor (6), a defect such as a crack or a break of the coating due to distortion may develop by the difference in thermal expansion coefficient between components. Furthermore, the crack or the break may lead to a progressive defect such as dark spots.

The advance in sealing techniques has fairly mitigated the problem of dark spots. However in practice, the deterioration is caused by two or more of the above factors, which makes it difficult to take effective preventive measure. In typical sealing method, the organic light emitting element formed over a substrate is sealed with sealant, and drying agent such as barium oxide is applied in the spaces. Unfortunately, conventional preventive measures have failed to suppress the deterioration of the light emitting apparatus to an acceptable level.

SUMMARY OF THE INVENTION

The purpose of the present invention is to solve the above problems in order to improve the reliability of a light emitting apparatus comprising TFTs and organic light emitting elements.

For this purpose, according to the present invention, a light emitting apparatus with pixels consisting of electrically connected TFTs and light emitting elements has a construction wherein the light emitting elements are formed by laminating an anode layer, a cathode layer, and an interposed layer containing light emitting material, surrounding the upper surface, the lower surface and the side surface of the light emitting element with an inorganic insulation layer, and the anode layer, the cathode layer and the layer containing light emitting material respectively contact with the surrounding inorganic insulation layer. The inorganic insulation layer is formed of silicon nitride or oxynitride of silicon such as a silicon nitride film or a silicon oxynitride film, or, nitride or oxynitride of aluminum such as aluminum nitride or aluminum oxynitride. More preferably, the silicon nitride film formed by radio frequency sputtering (RF sputtering) with frequency ranging from 13.56 MHz to 120 MHz and having silicon as a target is applied.

The silicon nitride film manufactured by the RF sputtering has improved effect of blocking the external impurities and an effect of suppressing the deterioration of the light emitting element by satisfying one of the following conditions; (1) a silicon nitride film with etching rate of 9 nm/min or less (preferably, 0.5 to 3.5 nm/min or less), (2) hydrogen concentration of $1\times10^{21}$ atoms/cm$^3$ or less (preferably $5\times10^{20}$ atoms/cm$^3$ or less), (3) hydrogen concentration of $1\times10^{21}$ atoms/cm$^3$ or less (preferably $5\times10^{20}$ atoms/cm$^3$ or less), and oxygen concentration from $5\times10^{18}$ to $5\times10^{21}$ atoms/cm$^3$ (preferably $1\times10^{19}$ to $1\times10^{21}$ atoms/cm$^3$), (4) etching rate of 9 nm/min or less (preferably, 0.5 to 3.5 nm/min or less), and hydrogen concentration of $1\times10^{21}$ atoms/cm$^3$ or less (preferably $5\times10^{20}$ atoms/cm$^3$ or less), or (5) etching rate of 9 nm/min or less (preferably, 0.5 to 3.5 nm/min or less), hydrogen concentration of $1\times10^{21}$ atoms/cm$^3$ or less (preferably $5\times10^{20}$ atoms/cm$^3$ or less), and oxygen concentration from $5\times10^{18}$ to $5\times10^{21}$ atoms/cm$^3$ (preferably $1\times10^{19}$ to $1\times10^{21}$ atoms/cm$^3$).

In a construction wherein a display screen has light emitting elements arranged in matrix, the most preferable construction of an insulation layer to partition the each pixel comprises a positive-type or a negative-type photosensitive organic resin material and has a curvature radius of 0.2 to 2 μm or continuously varying curvature radiuses within the above range at the end of the patterns, and a tapered surface with an inclination angle from 10 to 75 degrees, preferably from 35 to 45 degrees. The construction of a pixel in the light emitting apparatus according to the invention can mitigate the stress on the electrode ends of the pixel and suppress the deterioration of the light emitting element, by forming an insulation layer which covers ends of the individual electrode (either anode or cathode) of each pixel connecting to the TFT to partition each pixel, and by forming a layer containing the light emitting material, and one of the anode layer or the cathode layer, from over the pixel electrode to over the insulation layer.

The construction of a light emitting apparatus according to the invention will be described below.

A light emitting apparatus comprising a TFT having a semiconductor layer, a gate insulation film and a gate electrode, and a light emitting element having an organic compound layer containing light emitting material between a cathode layer and an anode layer, comprises, a second inorganic insulation layer on the gate electrode, a first organic insulation layer on the second inorganic insulation layer, a third inorganic insulation layer on the first organic insulation layer, an anode layer on the third inorganic insulation layer, a second organic insulation layer overlapping with the end of the anode, the second organic insulation layer having an inclination angle from 35 to 45 degrees, a fourth inorganic insulation layer formed on the upper surface and the side surface of the second organic insulation layer, the fourth inorganic insulation layer having an opening over an anode, an organic compound layer formed in contact with the anode layer and the fourth inorganic insulation layer, the organic compound layer containing the light emitting material, and a cathode layer formed in contact with the organic compound layer containing the light emitting material, wherein;

the third inorganic insulation layer and the fourth inorganic insulation layer comprise silicon nitride or aluminum nitride.

A light emitting apparatus comprising a pixel section having a TFT having a semiconductor layer, a gate insulation film and a gate electrode, and a light emitting element including an organic compound layer containing light emitting material between an anode layer and a cathode layer, and a driving circuit section formed with a TFT having a semiconductor layer, a gate insulation film and a gate electrode, the driving circuit section being formed in the peripheral region of the pixel section, comprising;

a first inorganic insulation layer under the semiconductor layer, a second inorganic insulation layer on the gate electrode, a first organic insulation layer on the second inorganic insulation layer, a third inorganic insulation layer on the first organic insulation layer, an anode layer formed on the third inorganic insulation layer, a second organic insulation layer overlapping with the end of the anode layer, the second organic insulation layer having an inclination angle from 35 to 45 degrees, a fourth inorganic insulation layer formed on the upper surface and the side surface of the second organic insulation layer, the fourth inorganic insulation layer having an opening over the anode layer, an organic compound layer formed in contact with the anode layer and the fourth inorganic insulation layer, the organic compound layer containing the light emitting material, and a cathode layer formed in contact with the organic compound layer containing the light emitting material, wherein;

the third inorganic insulation layer and the fourth inorganic insulation layer comprise silicon nitride or aluminum nitride, seal patterns are formed on the fourth inorganic insulation layer, and some or all of the seal patterns overlap with the driving circuit section.

The cathode layer may have the fifth inorganic insulation layer thereon, which is formed with nitride of silicon or aluminum.

The third to the fifth inorganic insulation layers have the above mentioned etching characteristics, and hydrogen concentration and oxygen concentration in the above range. By reducing the density of N—H bond, Si—H bond and the Si—O bond, the construction according to the invention can improve thermal stability of a film and make a fine film.

A light emitting apparatus comprising a pixel section having a TFT having a semiconductor layer, a gate insulation film and a gate electrode, and a light emitting element including an organic compound layer containing light emitting material between an anode layer and a cathode layer, and a driving circuit section formed with a TFT having a semiconductor layer, a gate insulation film and a gate electrode, the driving circuit section being formed in the peripheral region of the pixel section, wherein;

a barrier layer formed from an organic insulation layer on the pixel section extends over the driving circuit section, an inorganic insulation layer comprising silicon nitride or aluminum nitride is formed on the upper surface and the side surface of the barrier layer, seal patterns are formed over the inorganic insulation layer, some or all of the seal patterns overlap with the driving circuit section, and a connection between the cathode layer and the wiring formed under the anode layer is provided inside of the seal patterns.

A light emitting apparatus comprising a pixel section having a first TFT having a semiconductor layer, a gate insulation film and a gate electrode, and a light emitting element including an organic compound layer containing light emitting material between an anode layer and a cathode layer, and a driving circuit section formed with a second TFT having a semiconductor layer, a gate insulation film and a gate electrode, the driving circuit section being formed in the peripheral region of the pixel section, wherein;

a barrier layer formed from an organic insulation layer on the pixel section extends over the driving circuit section, an inorganic insulation layer comprising silicon nitride or aluminum nitride is formed on the upper surface and the side surface of the barrier layer, seal patterns are formed the inorganic insulation layer, the first TFT is formed inside of the seal patterns, all or some of the second TFT overlap with the seal patterns and, a connection between the anode layer and the wiring formed under the anode layer is provided inside of the seal patterns.

The inorganic insulation layer comprises silicon nitride manufactured by the RF sputtering method, and has the above mentioned etching characteristics, and hydrogen concentration and oxygen concentration in the above range.

Another aspect of the invention provides a method to manufacture the light emitting apparatus, as described below.

A method for manufacturing a light emitting apparatus comprising a pixel section having a TFT having a semiconductor layer, a gate insulation film and a gate electrode, and a light emitting element including an organic compound layer containing light emitting material between an anode layer and a cathode layer, and a driving circuit section formed with a TFT having a semiconductor layer, a gate insulation film and a gate electrode, the driving circuit section being formed in the peripheral region of the pixel section, comprising steps of;

forming a first inorganic insulation layer on a substrate, forming a semiconductor layer comprising crystalline silicon on the first inorganic insulation layer, forming a gate insulation film on the semiconductor layer and a gate electrode on the gate insulation film, and, forming an impurity region of one conductive type and another impurity region of complementary conductive type in the semiconductor layer, forming a second inorganic insulation layer on the gate electrode, forming a first organic insulation layer on the second inorganic insulation layer, forming a third inorganic insulation layer on the second organic insulation layer, forming an anode layer in contact with the third inorganic insulation layer, forming a second organic insulation layer overlapping with the end of the anode layer, the second organic insulation layer having an inclination angle from 35 to 45 degrees, forming a fourth inorganic insulation layer on the upper surface and the side surface of the second organic insulation layer, the fourth inorganic insulation layer having an opening over the anode layer, forming an organic compound layer containing the light emitting material in contact with the anode layer, the organic compound layer having an end overlapping with the fourth inorganic insulation layer, and, forming a cathode layer in contact with the organic compound layer containing the light emitting material, wherein, the third inorganic insulation layer and the fourth inorganic insulation layer comprise silicon nitride or aluminum nitride formed by the RF sputtering.

Further, another construction of a method for manufacturing a light emitting apparatus comprising a pixel section having a TFT having a semiconductor layer, a gate insulation film and a gate electrode, and a light emitting element including an organic compound layer containing light emitting material between an anode layer and a cathode layer, and a driving circuit section formed with a TFT having a semiconductor layer, a gate insulation film and a gate electrode, the driving circuit section being formed in the peripheral region of the pixel section, comprising steps of;

forming a first inorganic insulation layer on a substrate, forming a semiconductor layer comprising crystalline silicon on the first inorganic insulation layer, forming a gate insulation film and a gate electrode on the semiconductor layer, and, forming an impurity region of one conductive type and another impurity region of complementary conductive type in the semiconductor layer, forming a second inorganic insulation layer on the gate electrode, forming a first organic insulation layer on the second inorganic insulation layer, forming a third inorganic insulation layer on the second organic insulation layer, forming an anode layer in contact with the third inorganic insulation layer, forming a second organic insulation layer overlapping with the end of the wiring layer, the second organic insulation layer having an inclination angle from 35 to 45 degrees, forming a fourth inorganic insulation layer on the upper surface and the side surface of the second organic insulation layer, the fourth inorganic insulation layer having an opening over the anode layer, forming an organic compound layer containing the light emitting material in contact with the anode layer, the organic compound layer having an end overlapping with the fourth inorganic insulation layer, forming a cathode layer in contact with the organic compound layer containing the light emitting material, forming seal patterns on the fourth insulation layer at a position in which some or all of the seal patterns overlap with the driving circuit section, and, adhering a sealing plate in alignment with the seal patterns, wherein, the third inorganic insulation layer and the fourth inorganic insulation layer comprise silicon nitride or aluminum nitride formed by the RF sputtering.

In the above construction according to the invention, the third and the fourth inorganic insulation layers comprise silicon nitride by the RF sputtering method using only nitrogen as sputtering gas and having silicon as a target. The third inorganic insulation layer is formed after formation of the first organic insulation layer, by heating and dehydrating under reduced pressure, while the reduced pressure is maintained. The fourth inorganic insulation layer is formed after formation of the second organic insulation layer, by heating and dehydrating under reduced pressure, while the reduced pressure is maintained.

The light emitting apparatus herein refers to the apparatus which uses electro-luminescence for emitting light, in general. The light emitting apparatus includes a TFT substrate in which circuitry is formed with TFT on a substrate for light emission, an EL panel which incorporates the light emitting elements formed with electro-luminescence material on a TFT substrate, and an EL module which incorporates external circuitry into an EL panel. The light emitting apparatus according to the invention can be incorporated in a variety of electronics such as a mobile telephone, a personal computer and a television receiver.

BRIEF DESCRIPTION OF THE DRAWINGS

FIGS. 8A to 8D are cross-sectional views which illustrate manufacturing processes of the light emitting apparatus according to the invention.

FIGS. 9A to 9C are cross-sectional views which illustrate manufacturing processes of the light emitting apparatus according to the invention.

FIGS. 10A to 10C are cross-sectional views which illustrate manufacturing processes of the light emitting apparatus according to the invention.

FIGS. 11A and 11B are cross-sectional views which illustrate manufacturing processes of the light emitting apparatus according to the invention.

FIGS. 29A and 29B are views which illustrate the MOS construction.

DESCRIPTION OF THE PREFERRED EMBODIMENTS

Figure 1:
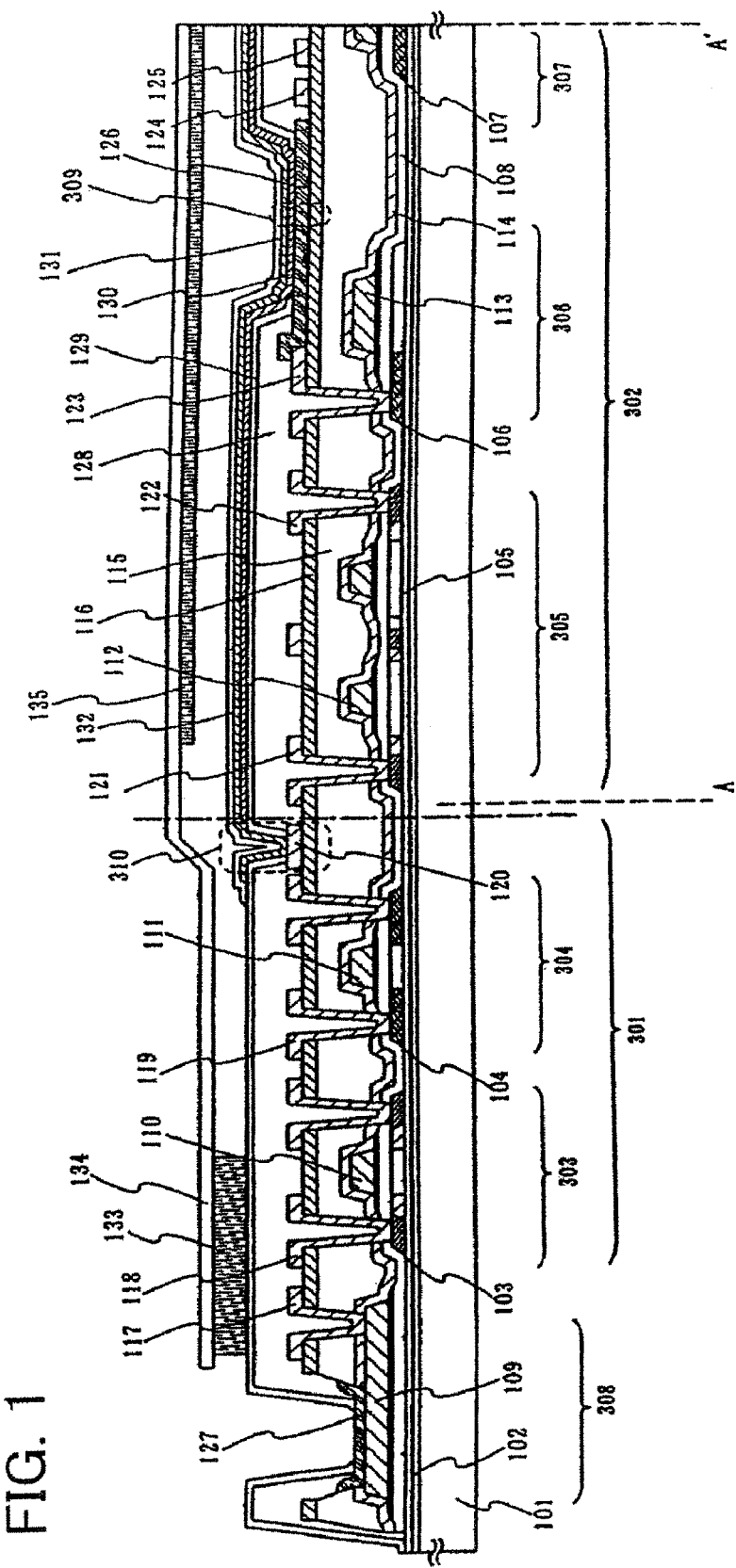
FIG. 1 is a cross-sectional view which illustrates the construction of the light emitting apparatus according to the invention.

The embodiments of the invention will be described with reference to the accompanied drawings. Common components among several drawings have same reference numerals.

FIG. 1 shows an exemplary construction of a light emitting apparatus of the active matrix driving method according to the invention. TFTs are provided in a pixel section 302 and a driving circuit section 301 which is formed in the peripheral region of the pixel section 302. The semiconductor layer forming the channel forming region of the TFT may comprise amorphous silicon or polycrystalline silicon. The apparatus according to the invention may use either type of silicon.

The substrate 101 comprises a glass substrate or an organic resin substrate. The organic resin has less weight than the glass, which is advantageous to reduce the weight of the light emitting apparatus as a whole. Organic resin such as polyimide, polyethylene terephthalate (PET), polyethylene naphthalate (PEN), polyether sulfone (PES), and aramid is applicable to manufacture the light emitting apparatus. Barium borosilicate glass and almino-borosilicate glass, which are known as no-alkali glass, are preferred to be used as a glass substrate. The thickness of the glass substrate may be 0.5 to 1.1 mm, however, if it is necessary to reduce the weight of the apparatus, the thickness should be reduced. It is desirable to employ a glass with small specific density such as 2.37 g/cm$^3$ to furthermore reduce the weight.

As shown in FIG. 1, a n-channel type TFT 303 and p-channel type TFT 304 are flawed in the driving circuit section 301, and a n-channel type first TFT 305, a p-channel type fourth TFT 306 and a capacity section 307 are formed in the pixel section 302. The fourth TFT 306 connects to an anode layer 126 of the light emitting element 309.

These TFTs comprise semiconductor layers 103 to 106 on the first inorganic insulation layer 102 comprising silicon nitride or silicon oxynitride, a gate insulation film 108, and gate electrodes 110 to 113. A second inorganic insulation layer 114 comprising silicon nitride or silicon oxynitride containing hydrogen is formed on the gate electrode. The second inorganic insulation layer 114 in combination with the first inorganic insulation layer 102 serves as a protective film which prevents contamination of the semiconductor layers caused by diffusion of impurities such as moisture or metal into the semiconductor layers.

The first organic insulation layer 115 of 0.5 to 1 μm thickness comprising one of polyimid, polyamide, polyimidamide, acrylic, BCB (benzocyclobutene) is formed as a planarizing layer on the second inorganic insulation layer 114. The first organic insulation layer 115 is formed by spin coating one of the above organic compounds, then applying calcination. The organic insulation material is hygroscopic and absorbs and occludes moisture. When the occluded moisture is released, oxygen is supplied to the organic compound contained in the light emitting element formed over the organic insulation layer, which deteriorates the organic light emitting element. To prevent the occlusion and the release of moisture, a third inorganic insulation layer 116 of 50 to 200 nm thickness is formed on the first organic insulation layer 115. The third inorganic insulation layer 116 must be a fine film in order to adhere to the underlining layer more securely for acting as a barrier. The layer 116 is formed preferably by sputtering with inorganic insulation material selected from silicon nitride, silicon oxynitride, aluminum oxynitride and aluminum nitride.

The organic light emitting element 309 is formed on the third inorganic insulation layer 116. In a light emitting apparatus emitting light through the substrate 101, ITO layer (indium oxide, tin) is formed as an anode layer 126 on the third inorganic insulation layer 116. ITO may be added with zinc oxide or gallium for planarizing, or reducing the resistance. Wirings 117 to 125 are formed prior to the formation of the anode layer 126, overlap with the anode layer 126 over the third inorganic insulation layer 116 to form an electric connection.

The second organic insulation layer (barrier layer) 128 which separates each pixel is formed of material selected from polyimide, polyamide, polyimideamide, acrylic and benzocyclobutene (BCB). Thermosetting material or photocuring material is applicable. The second organic insulation layer (barrier layer) 128 is formed by applying the one of the above organic insulation material with thickness of 0.5 to 2 to cover all surface. Then, an opening fitting to the anode layer 126 is formed. At this time, the opening is formed so as to cover the end of the anode layer 126 and the inclination angle on its side is 35 to 45 degrees. The second organic insulation layer (barrier layer) 128 extends not only over the pixel section 302 but also over the driving circuit section 301 and covers the wiring 117 to 124, thus, it also serves as an interlayer insulation film between layers.

The organic insulation material is hygroscopic and absorbs and occludes moisture. When the occluded moisture is released, the moisture is supplied to the organic compound of the light emitting element 309, which deteriorates the organic light emitting element. To prevent the occlusion and the release of moisture, a fourth inorganic insulation layer 129 of 10 to 100 nm thickness is formed on the second organic insulation layer 128. The fourth inorganic insulation layer 129 is formed with an inorganic insulation material comprising nitrides. Particularly, it is formed with an inorganic insulation material selected from silicon nitride, aluminum nitride and aluminum oxynitride. The fourth inorganic insulation layer 129 is formed so as to cover the upper surface and side surface of the second organic insulation layer 128, and its end overlapping with the anode layer 126 is tapered.

The organic light emitting element 309 is formed with an anode layer 126, a cathode layer 131 comprising alkali metal or alkali earth metal, and an interposing organic compound layer 130 containing light emitting material. The organic compound layer 130 containing the light emitting material is formed by laminating one or more layers. Each layer is named according to its purpose and function; a positive hole injection layer, a positive hole transferring layer, a light emitting layer, an electrons transferring layer and an electrons injection layer. These layers can be formed with one of low molecular weight organic compounds, middle molecular weight organic compounds, high molecular weight organic compounds, or combination of two of the above compounds appropriately. Also, a mixed layer comprising mixture of the electron transferring material and the positive hole transferring material, or a mixed connection forming mixed region between each interface can be made.

The cathode layer 131 is formed with alkali metal or alkali earth metal having smaller work function, such as magnesium (Mg), lithium (Li) or calcium (Ca). Preferably, an electrode comprising MgAg (a mixture of Mg and Ag with ratio of 10:1) may be used. Other materials suitable to the electrode include MgAgAl, LiAl and LiFAl. The combination of fluoride of alkali metal or alkali earth metal, and low resistance metal such as aluminum can be used, as well. The cathode layer 131 as a common electrode is formed across a plurality of pixels, and connects to the wiring 120 outside of the pixel section 302 or between the pixel section 302 and the driving circuit section 301, then leads to an external terminal. In FIG. 1, the connection 310 is shown in the region enclosed by the dotted line.

On that layer, a fifth inorganic insulation layer 132 may be formed with one of silicon nitride, diamond-like-carbon (DLC), aluminum oxynitride, aluminum oxide or aluminum nitride. Particularly, the DLC film is known to have a high gas barrier characteristic against oxygen, CO, $CO_2$ and $H_2O$. It is desirable to form the fifth inorganic insulation layer 132 in succession after the formation of the cathode 131 without exposing the substrate to the atmosphere. A buffer layer made of silicon nitride may be provided under the fifth inorganic insulation layer 132 in order to improve adhesion.

Although not shown in the figure, a sixth inorganic insulation layer of 0.5 to 5 nm thickness which allows flow of a tunnel current may be formed between the anode layer 126 and the organic compound layer 130 containing light emitting material. The sixth inorganic insulation layer has an effect to prevent short circuit caused by any irregularity on the surface of the anode, and an effect to prevent alkali metal used for the cathode, or the like, from diffusing to the lower layer.

The second organic insulation layer 128 formed over the pixel section 302 extends to the driving circuit section 301, and seal patterns 133 are formed on the fourth inorganic insulation layer 129 formed on the second organic insulation layer 128. Some or all of the seal patterns 133 overlap with the driving circuit section 301 and the wiring 117 which connects the driving circuit section 301 and the input terminal, which reduces the area of the frame region (peripheral region of the pixel section) of the light emitting apparatus.

A sealing plate 134 is secured via the seal patterns 133. The sealing plate 134 may comprise metal such as stainless steel and aluminum. Also, you may use a glass substrate. Desiccant 135 such as barium oxide may be included in the region surrounded by the seal patterns 133 and the sealing plate 134, in order to prevent deterioration caused by moisture. The sealing plate made of an organic resin may be flexible and have 30 to 120 μm thickness. The surface of the sealing plate may be coated with an inorganic insulation material such as DLC and silicon nitride, as a gas barrier layer. One exemplary material for the seal patterns is epoxy adhesive. The side surface of the seal patterns may be coated with a film comprising inorganic insulation material, which prevents vapor from penetrating from the side surface.

In FIG. 1, the first TFT 305 has a multi-gate construction, completed with a lightly doped drain (LDD) to reduce the off current. The p-channel type fourth TFT 306 is provided with an impurity region overlapping with the gate electrode.

Figure 2:
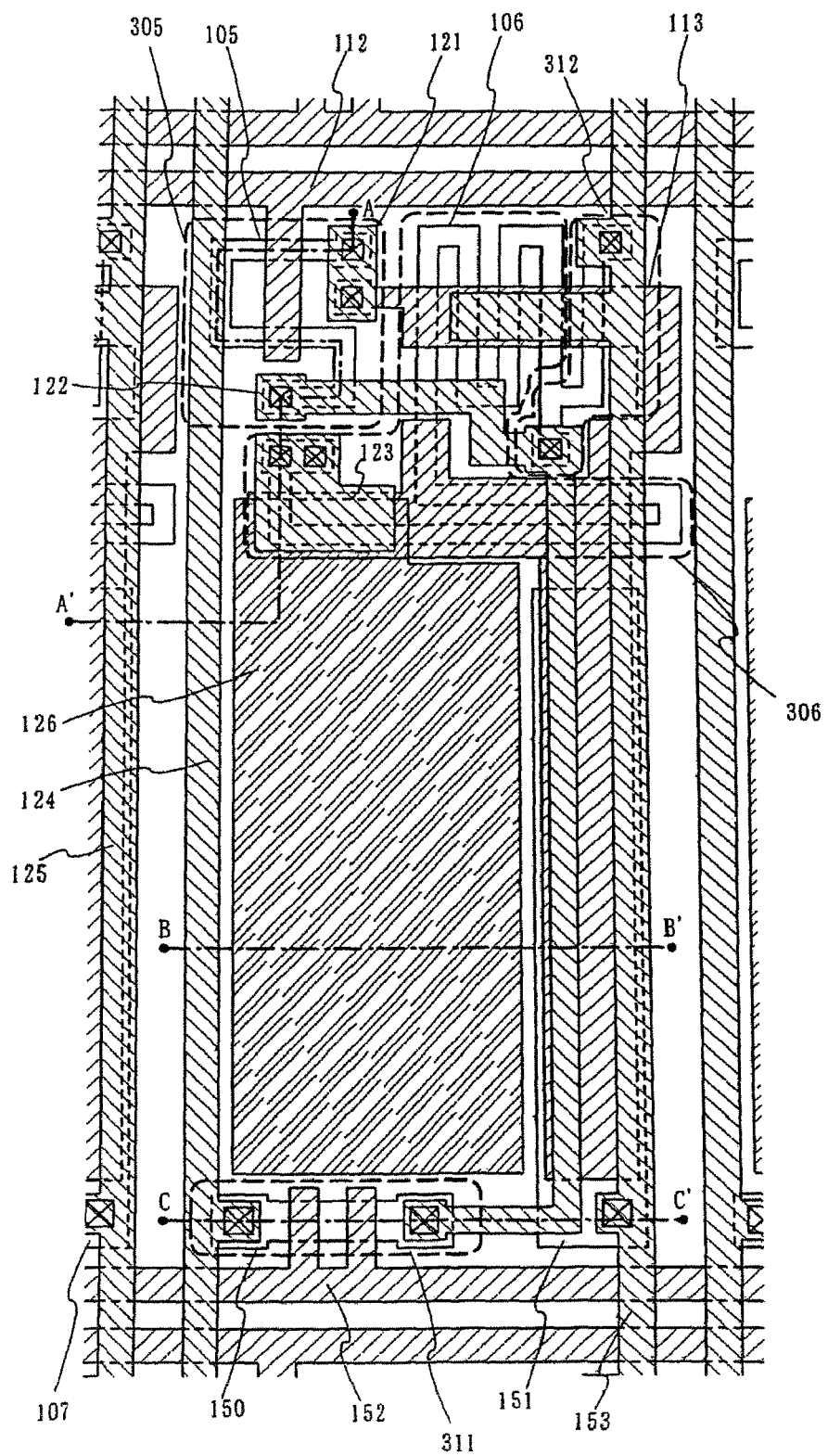
FIG. 2 is a top view which illustrates the construction of the pixel section of the light emitting apparatus according to the invention.
Figure 3:
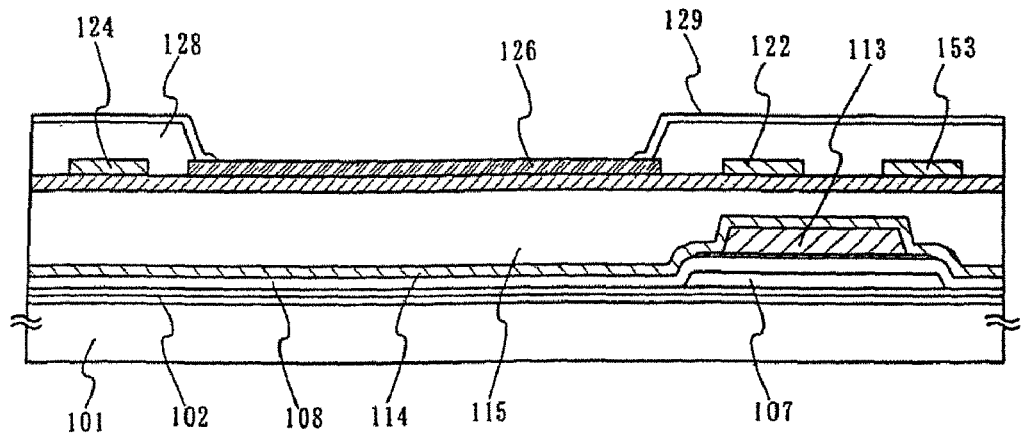
FIG. 3 is a cross-sectional view which illustrates the construction of the pixel section of the light emitting apparatus according to the invention.
Figure 4:
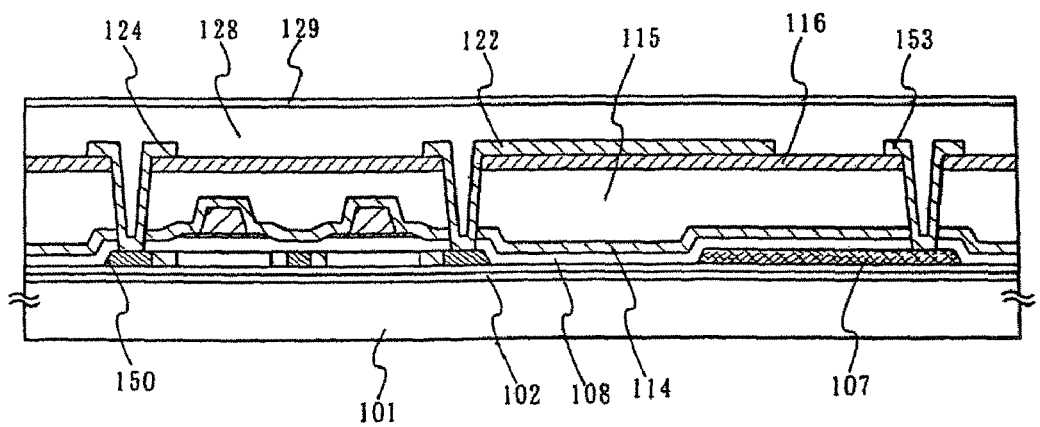
FIG. 4 is another cross-sectional view which illustrates the construction of the pixel section of the light emitting apparatus according to the invention.
Figure 17:
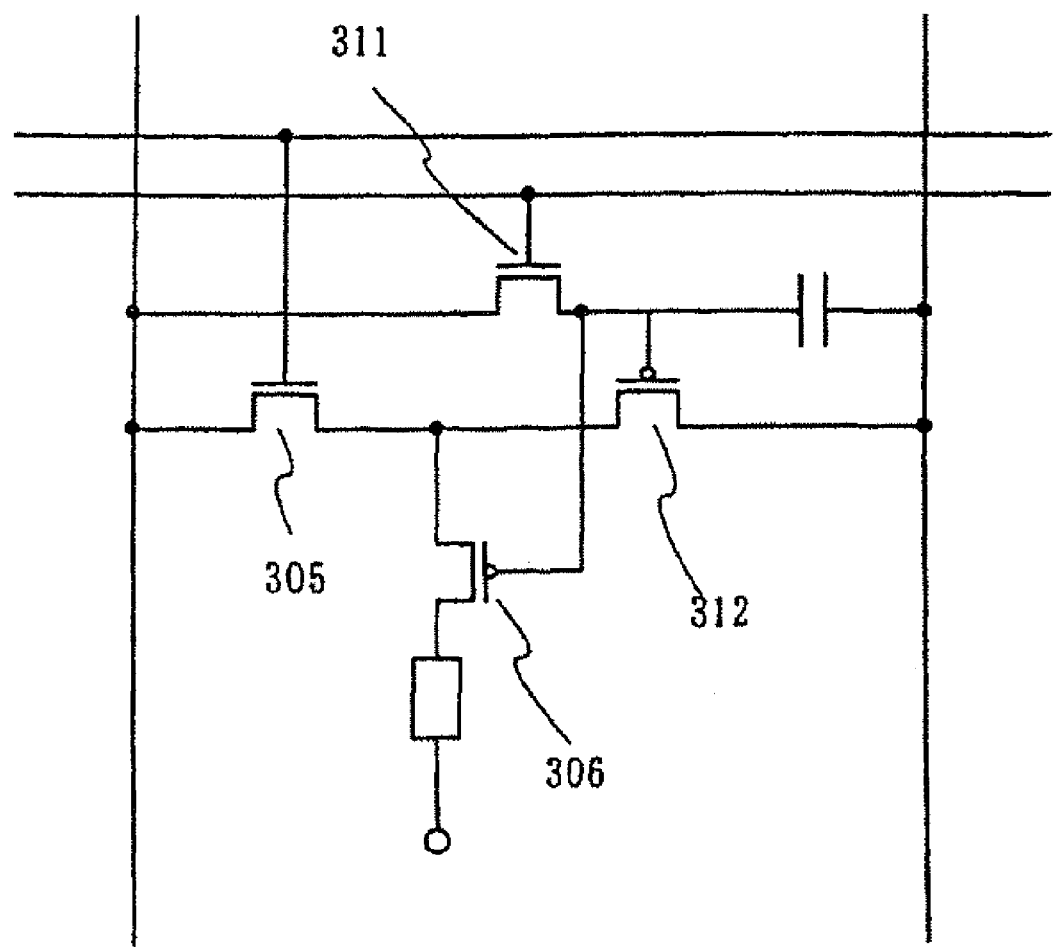
FIG. 17 is a circuit diagram equivalent to a pixel.

The top view of one pixel in the pixel section provided with the above TFT is shown in FIG. 2. In order to illustrate the arrangement of each TFT clearly, the patterns of the light emitting element 309, the second organic insulation layer 128 and the fourth inorganic insulation layer 129 are not shown in FIG. 2. One pixel contains a first TFT 305, a second TFT 311, a third TFT 312, a fourth TFT 306 and a capacity section 307. FIG. 17 schematically shows a circuit equivalent to the construction shown in FIG. 2. FIG. 1 shows the cross section across the line A-A' of FIG. 2. FIG. 3 shows the cross section across the line B-B', and FIG. 4 shows the cross section across the line C-C', of FIG. 2.

Figure 15:
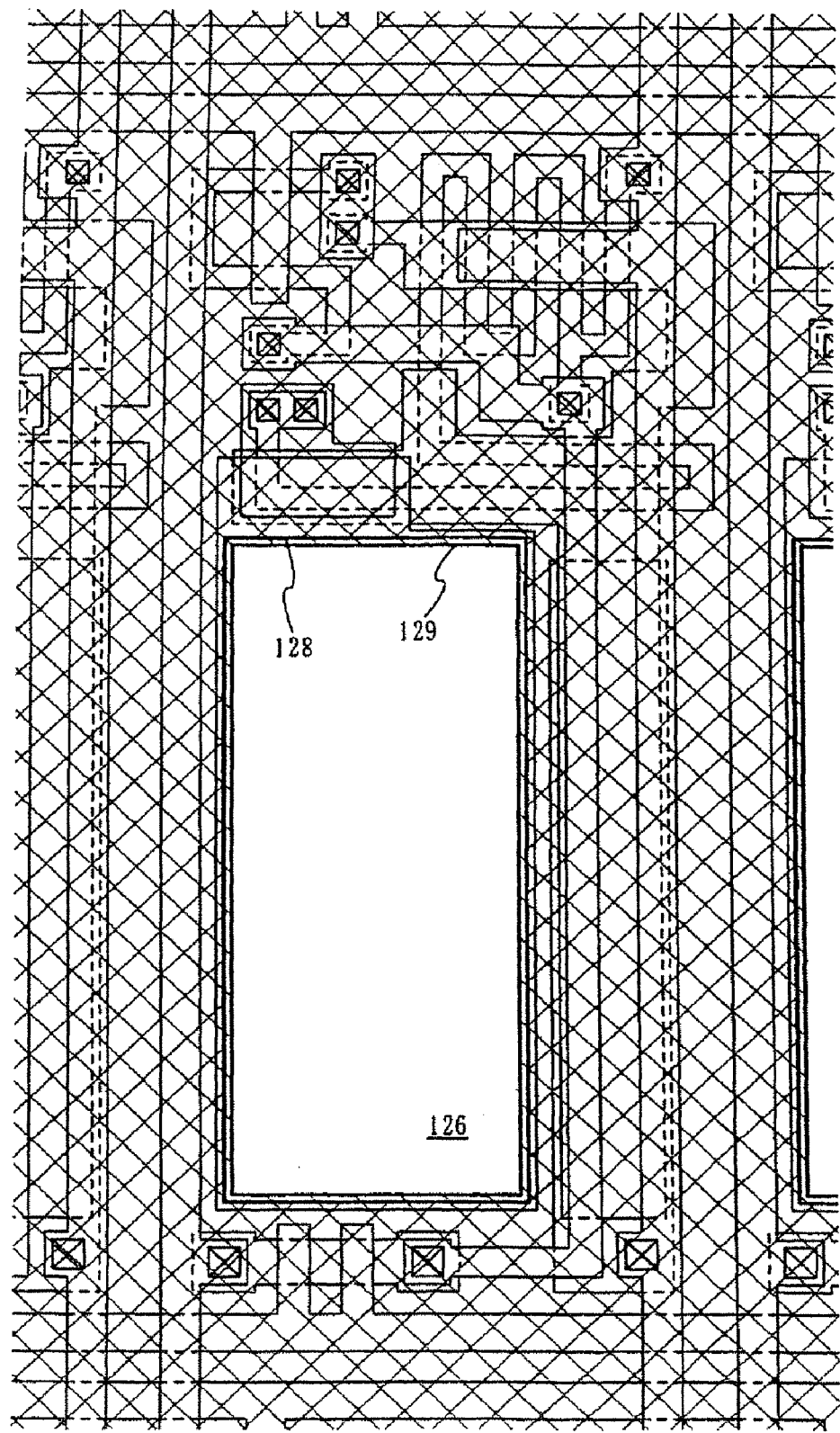
FIG. 15 is a top view which illustrates a construction of the pixel section of the light emitting apparatus according to the invention.
Figure 16:
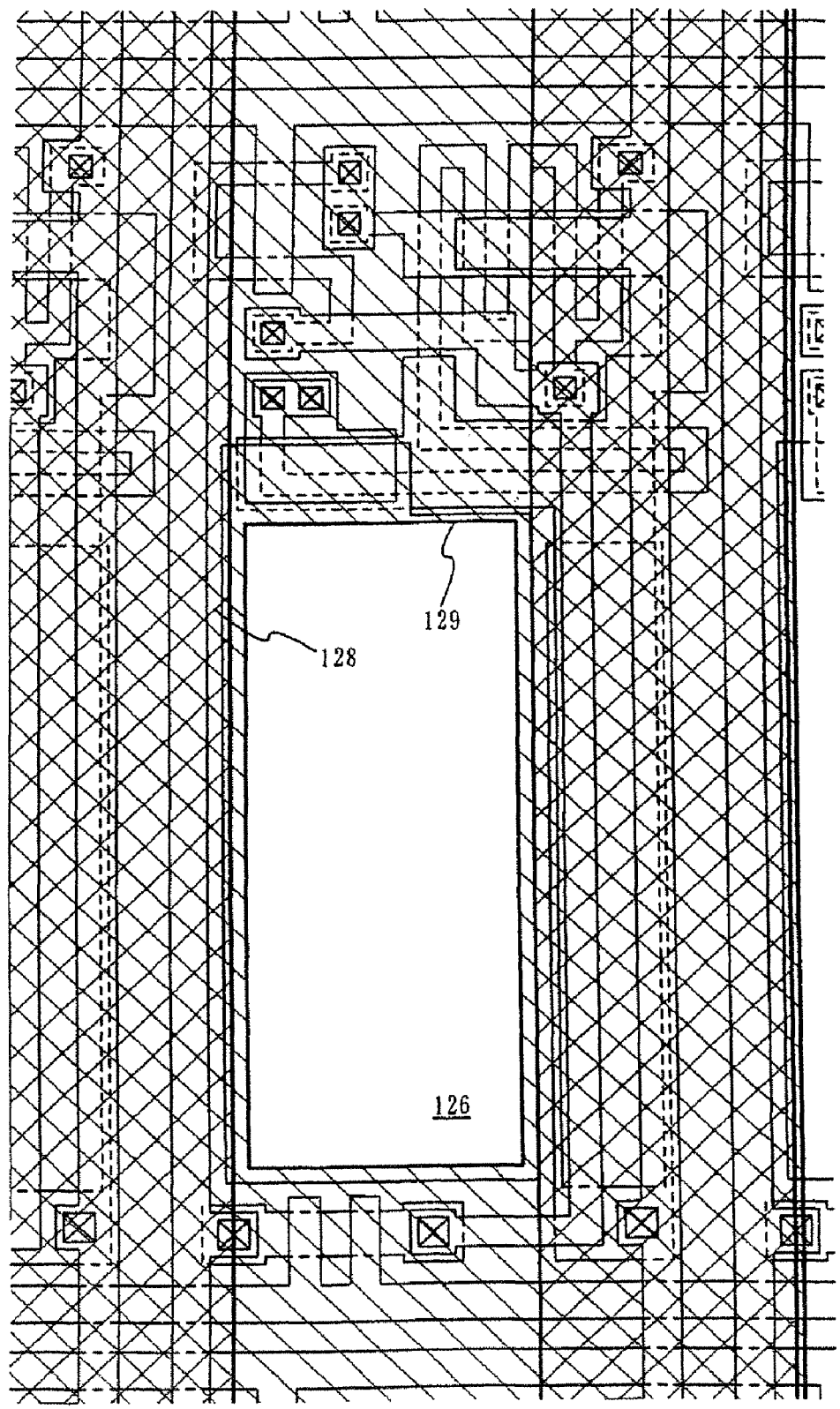
FIG. 16 is a top view which illustrates a construction of the pixel section of the light emitting apparatus according to the invention.

One exemplary construction of the second organic insulation layer 128 and the fourth inorganic insulation layer 129 in the pixel section is shown in FIG. 15, in which both of the second organic insulation layer 128 and the fourth inorganic insulation layer 129 cover the periphery of the anode layer 126. In another exemplary construction shown in FIG. 16, the second organic insulation later 128 may cover only two sides of the anode layer 126, while the fourth inorganic insulation layer 129 may cover all sides of the anode layer 126. Of course, the construction of a pixel shown in this figure is only example, and is not a requirement of the invention.

Although not shown in FIG. 1, the driving circuit section 301 has different circuitry for the gate signal driving circuit and the data signal driving circuit. The wirings 118 and 119 are connected to the n-channel type TFT 303 and the p-channel type TFT 304, respectively, and these TFTs, in turn, can be used to form a shift register, a latch circuit or a buffer circuit.

Figure 7A:
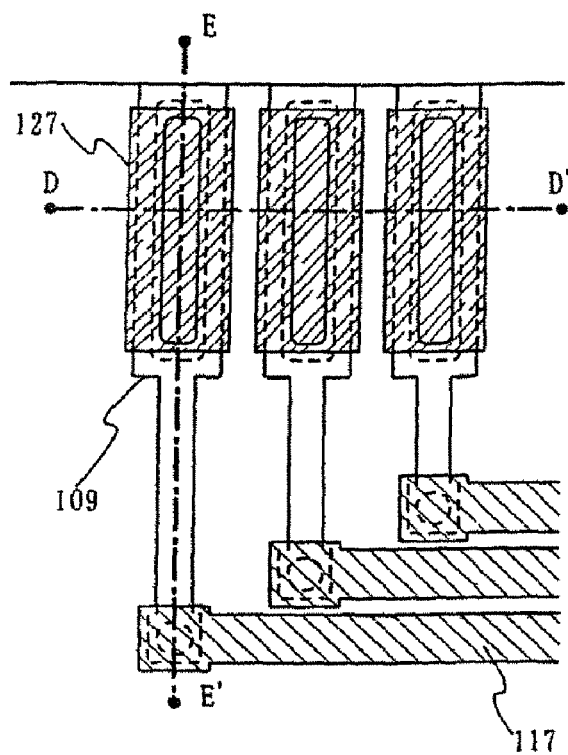
FIGS. 7A to 7C show a construction of the input terminal in the light emitting apparatus according to the invention.
Figure 7B:
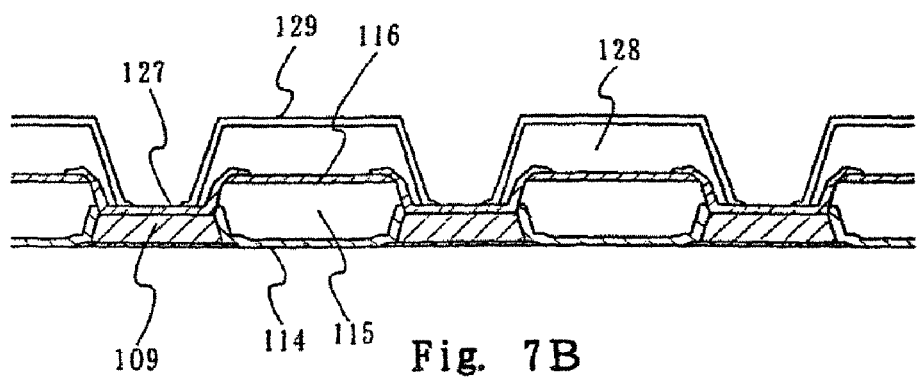
Figure 7C:
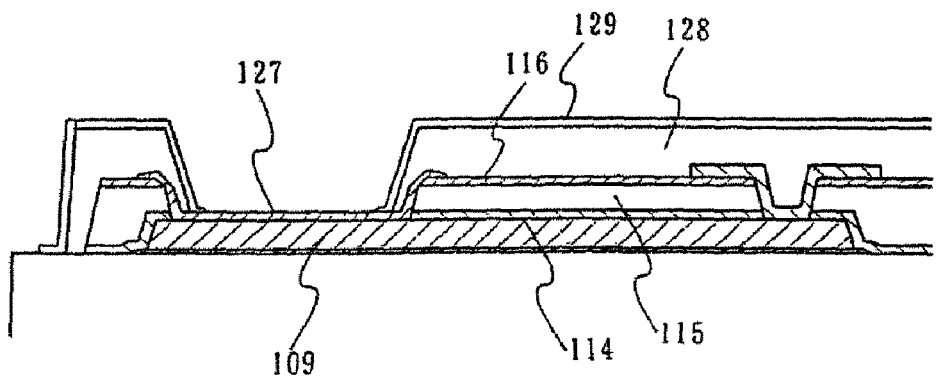

An input terminal 308 is formed from a wiring formed from the same layer as the gate electrode, or a wiring formed on the third inorganic insulation layer 116. FIG. 1 shows an example of an input terminal 308 formed from the same layer as the gate electrode, that is, the input terminal 308 is formed from conducting layers 109 and 127. The conducting layer 127 is formed of oxide conductive material, at the time when the anode layer 126 is formed. In practice, the part exposed to the surface is covered with the oxide conductive material to prevent the increase of surface resistance due to oxidation. FIG. 7 is a detailed illustration of the input terminal 308. FIG. 7A shows the top view, and FIGS. 7B and 7C show cross-sectional views across the line D-D' and E-E', respectively. The input terminal 308 is formed with the conducting layers 109 and 127.

As shown in FIG. 1, the first inorganic insulation layer 102 and the second inorganic insulation layer 114 are formed so as to sandwich the semiconductor layers 105 and 106. On the other hand, the organic light emitting element 309 is surrounded by the third inorganic insulation layer 116, the fifth inorganic insulation layer 132 and the fourth inorganic insulation layer 129. In other words, the semiconductor layers of the TFT and light emitting elements are coated with the inorganic insulation layers, respectively. The inorganic insulation layers are made from films of silicon nitride or silicon oxynitride, which forms a barrier against vapor and ionic impurities.

The possible source of alkali metal such as sodium which contaminates the first TFT 305 and the fourth TFT 306 includes the substrate 101 and the organic light emitting element 309. In order to prevent the contamination from them, the first TFT 305 and the fourth TFT 306 are surrounded by the first inorganic insulation layer 102 and the second inorganic insulation layer 114. As the organic light emitting element 309 suffers the severest damage from oxygen and moisture, a third inorganic insulation layer 116, a fourth inorganic insulation layer 129, and a fifth inorganic insulation layer 132 are formed with inorganic insulation material to prevent the contamination by oxygen or moisture. Also, these inorganic insulation layers serve to prevent the alkali metal element of the organic light emitting element 309 from diffusing to other sections.

Figure 5:
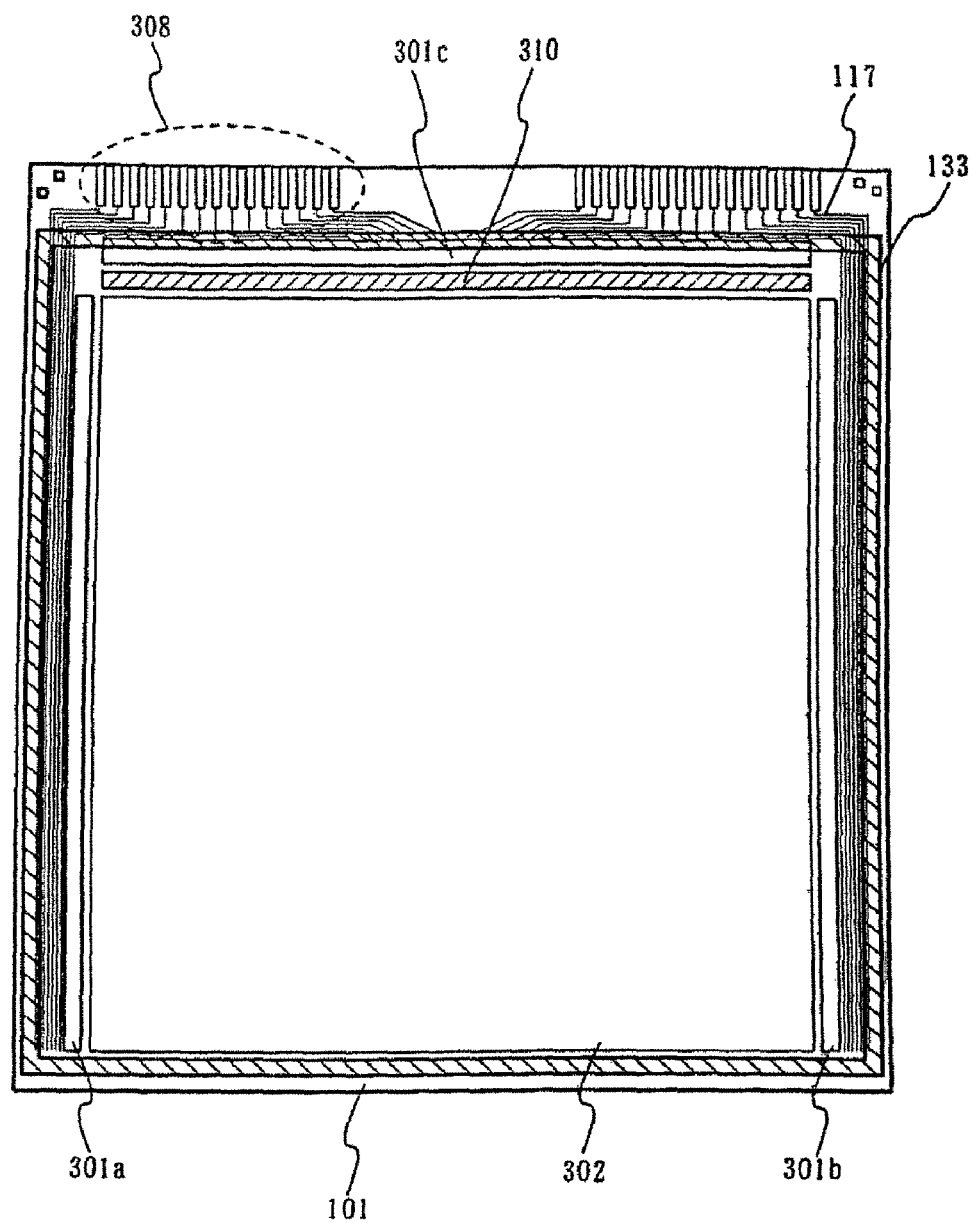
FIG. 5 is an outside view of a substrate comprising components of the light emitting apparatus according to the invention.

FIG. 5 shows an outside view of a substrate comprising components of the light emitting apparatus illustrated in FIGS. 1 to 4. The substrate 101 is provided with a pixel section 302, gate signal driving circuits 301a and 302b, a data signal driving circuit 301c, a connection to the cathode layer 310, an input/output terminal 308 and a wiring or a group of wirings 117. Seal patterns 133 are provided so that some or all of the patterns 133 overlap with the gate signal driving circuits 301a and 301b, data signal driving circuit 301c, and the wiring or the group of wirings 117 which connects these driving circuit sections to the input terminal, in order to reduce the area of the frame region (peripheral of the pixel section) of the light emitting apparatus. Although FIG. 5 shows only one cathode layer connection 310, the connection 310 may be provided on any location around the pixel section 302, as long as it does not interfere with the driving circuit sections 301a to 301c.

Figure 6:
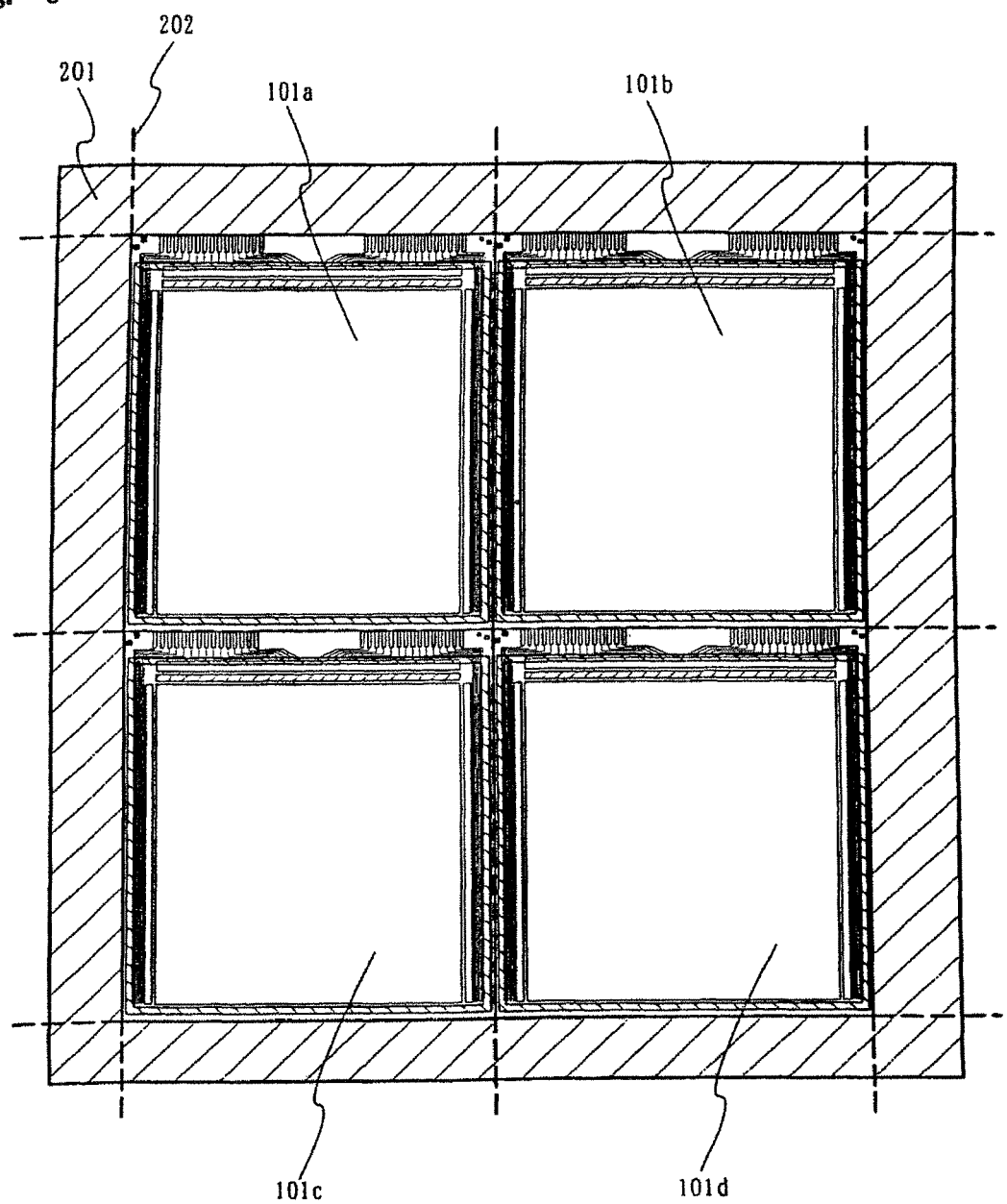
FIG. 6 is a view which illustrates a substrate constituting a light emitting apparatus formed on a mother glass, and its separation.

As shown in FIG. 6, a plurality of the substrates 101 (101a to 101d) having above construction are provided on a mother glass 201, and separated along the cutting lines 202 after the formation of one of the fourth inorganic insulation layer, the cathode layer, the fifth inorganic insulation layer or the sealing plate. The substrates are separated with a diamond cutter or a laser cutter. In order to make the separating process easier, the third to the fifth inorganic insulation layers and the first and the second organic insulation layers are preferably removed along the cutting lines 202.

As described, a TFT and a light emitting element are combined to form a pixel section to complete a light emitting apparatus. In the light emitting apparatus thus manufactured, driving circuits can be formed on the same substrate by using TFTs as the pixel section. As shown in FIG. 1, by surrounding the upper surface and the lower surface of the semiconductor film, the gate insulation film and the gate electrode, which are major components of a TFT, with blocking layers and the protective films comprising silicon nitride or silicon oxynitride, this construction prevents these components from being contaminated by alkali metal and organic material. The organic light emitting element, in turn, contains the alkali metal in part, and is surrounded by a protective film comprising one of silicon nitride, silicon oxynitride or DLC, and a gas barrier layer comprising an insulation film mainly consisting of silicon nitride or carbon, so that this construction prevents the penetration of oxygen or moisture from the outside.

The film comprising silicon nitride used for the inorganic insulation layers in this embodiment (silicon nitride film) is a highly fine film formed by the RF sputtering, according to the conditions shown in the table 1 (A typical example is illustrated). "RFSP-SiN" in the table indicates a silicon nitride film formed by the RF sputtering. "T/S" is the distance between the target and the substrate.

TABLE 1

RFSP-SiN processing condition

| | processing condition | representative example | comments |
|---|---|---|---|
| gas | $N_2$ or (noble gas)/$N_2$ | Ar/$N_2$ | each purity is 4N or more |
| gas flow ratio | $N_2$: 30~100%, noble gas: 0~70% | Ar:$N_2$ = 20:20(sccm) | noble gas may be introduced as gas for heating form the backside of a substrate |
| pressure (Pa) | 0.1~1.5 | 0.8 | |
| flequency (MHz) | 13~40 | 13.56 | |
| power (W/cm$^2$) | 5~20 | 16.5 | |
| substrate temperature (° C.) | RT (Room Temperature) ~350 | 200 | |
| target material | material carved out of single crystalline Si ingot | Si(1~10 Ωcm) | |
| T/S (mm) | 40~200 | 60 | |
| back-pressure (Pa) | $1 \times 10^{-3}$ or less (preferably $3 \times 10^{-5}$ or less) | $3 \times 10^{-5}$ | using turbo-molecular pump or cryopump |

Ar, as sputtering gas, is introduced to be sprayed on the back surface of the substrate to heat the same. The sprayed Ar is ultimately mixed with $N_2$ for sputtering. The values shown in the table 1 for forming a film are only representative values and not limited to those indicated here. As long as the physical parameters of the resulting SiN film fall in the range of the physical parameters shown in the table 4 (shown later), these conditions can be modified appropriately by the operator.

Figure 30:
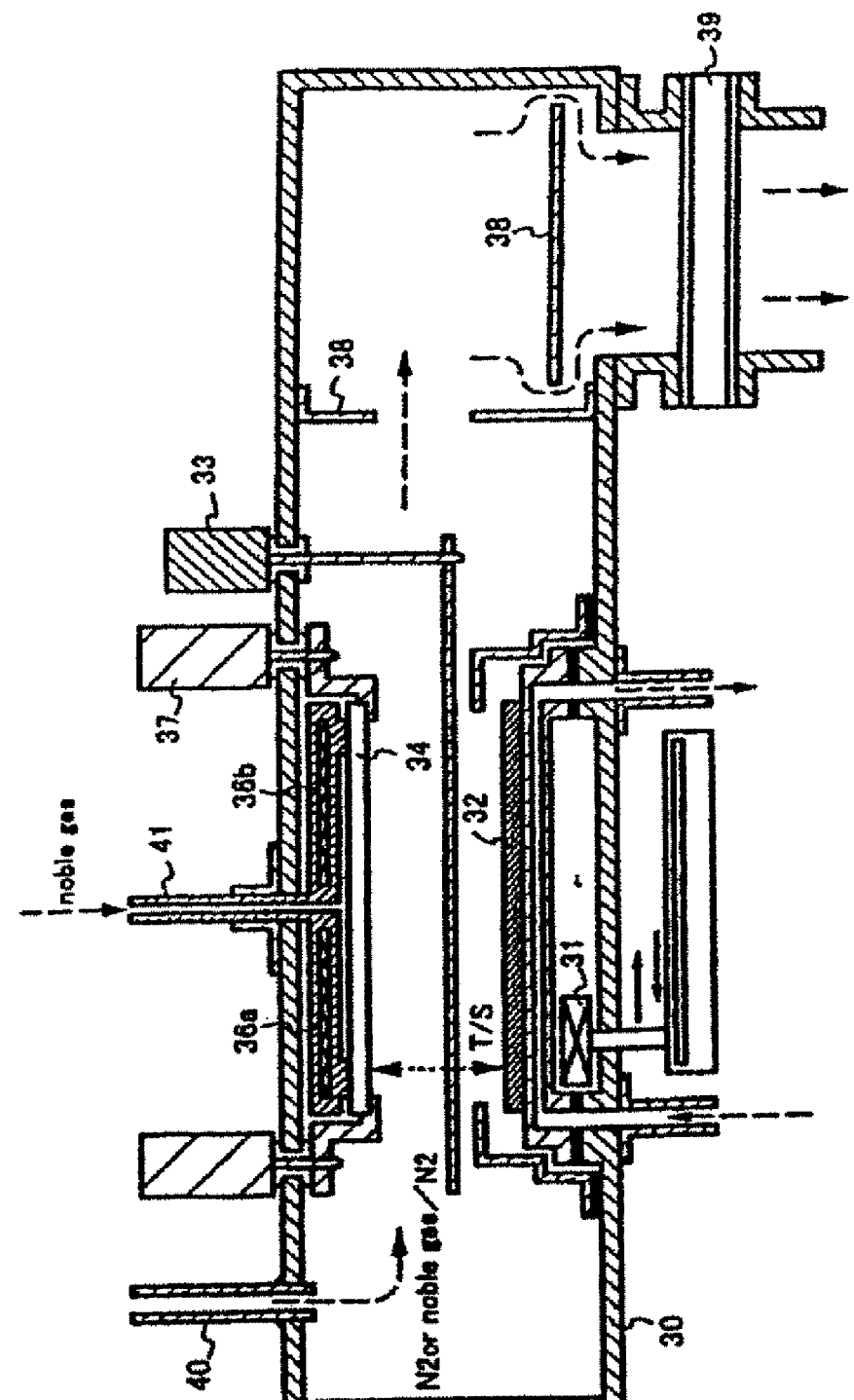
FIG. 30 is a view which illustrates a sputtering apparatus.

Next, a schematic view of a sputtering apparatus used to form a silicon nitrogen film by the above RF sputtering is shown in FIG. 30. In FIG. 30, 30 is a chamber wall, 31 is a movable magnet for forming magnetic field, 32 is a single crystal silicon target, 33 is a protective shutter, 34 is a substrate to be processed, 36a and 36b are heaters, 37 is a substrate chuck device, 38 is an antitack plate and 39 is a valve (conductance valve or main valve). The chamber wall 30 is provided with gas intake tubes 40 and 41 which introduce $N_2$ (or mix gas of $N_2$ and noble gas), and noble gas, respectively.

Table 2 shows conditions to form a silicon nitride film formed by the conventional plasma CVD method, for reference. "PCVD-SiN" in the table refers to a silicon nitride film formed by the plasma CVD method.

TABLE 2 plasma CVD condition

| | PCVD-SiN |
|---|---|
| gas | SiH/$NH_3$/$N_2$/$H_2$ |
| gas flow ratio (sccm) | SiH4:NH3:N2:H2 = 30:240:300:60 |
| pressure (Pa) | 159 |
| frequency (MHz) | 13.56 |
| power (W/cm$^2$) | 0.35 |
| substrate temperature (° C.) | 325 |

Table 3 shows the representative values of physical characteristics (physical parameters) of the silicon nitride film formed under the conditions in the table 1, and that formed under the conditions in the table 2. The differences between "RFSP-SiN (No. 1)" and "RFSP-SiN (No. 2)" are attributable to the difference between the film forming apparatuses, and do not impair the function of a silicon nitride film used as a barrier film according to the invention. The internal stress may be compressive or tensile, and the sign of the numerical value changes accordingly, but the table shows only the absolute value.

TABLE 3 comparison between representative SiN physical parameters

| | SiN prepared by the condition referring to the preparing condition in Table. 1 | | SiN prepared by the condition referring to the preparing condition in Table. 2 | |
|---|---|---|---|---|
| parameter | RFSP-SiN (No. 1) | RFSP-SiN (No. 2) | PCVD-SiN film | comments |
| specific inductive capacity | 7.02~9.30 | ← | ~7 | |
| refractive index | 1.91~2.13 | ← | 2.0~2.1 | Wavelength of irradiated light is 632.8 nm |
| internal stress (dyn/cm$^2$) | $4.17 \times 10^8$ | ← | $9.11 \times 10^8$ | |
| etching rate (nm/min) | 0.77~1.31 | 1~8.6 | ~30 | LAL500, 20° C. |
| Si concentration (atomic %) | 37.3 | 51.5 | 35.0 | RBS |
| N concentration (atomic %) | 55.9 | 48.5 | 45.0 | RBS |
| H concentration (atoms/cm$^3$) | $4 \times 10^{20}$ | — | $1 \times 10^{22}$ | SIMS |

TABLE 3-continued comparison between representative SiN physical parameters

| parameter | SiN prepared by the condition referring to the preparing condition in Table. 1 | | SiN prepared by the condition referring to the preparing condition in Table. 2 | comments |
| --- | --- | --- | --- | --- |
| | RFSP-SiN (No. 1) | RFSP-SiN (No. 2) | PCVD-SiN film | |
| O concentration (atoms/cm$^3$) | $8 \times 10^{20}$ | — | $3 \times 10^{18}$ | SIMS |
| C concentration (atoms/cm$^3$) | $1 \times 10^{19}$ | — | $4 \times 10^{17}$ | SIMS |

As shown in the table 3, the common characteristics in the RFSP-SiN (No. 1) and the RFSP-SiN (No. 2) are lower etching rate (the etching rate of the etching with LAL 500 at 20° C., ditto), and lower hydrogen concentration compared to those of the PCVD-SiN film. "LAL500" is the "LAL500 SA buffered hydrofluoric acid" which is solution of NH$_4$HF$_2$ (7.13%) and NH$_4$F (15.4%), manufactured by Hashimoto Kasei Co., Ltd. The absolute value of the internal stress is less than that of the silicon nitride film formed by the plasma CVD method.

Next, various physical parameters of the silicon nitride film formed by the inventors under the conditions in table 1 are summarized in the table 4.

TABLE 4

SiN physical parameters used in the present invention

| parameter | SiN film used in the present invention | comments |
| --- | --- | --- |
| specific inductive capacity | 7.0~9.5 (preferably 7.3~7.7) | |
| refractive index | 1.85~2.20 (preferably 1.90~2.15) | Wavelength of irradiated light is 632.8 nm |
| internal stress (dyn/cm$^2$) | $2 \times 10^{10}$ or less (preferably $5 \times 10^8$ or less) | |
| etching rate (nm/min) | 9 or less (preferably 0.5~3.5) | LAL500, 20° C. |
| Si concentration (atomic %) | 35~55 (preferably 37~52) | RBS |
| N concentration (atomic %) | 45~60 (preferably 48~56) | RBS |
| H concentration (atoms/cm$^3$) | $1 \times 10^{21}$ or less (preferably $5 \times 10^{20}$ or less) | SIMS |
| O concentration (atoms/cm$^3$) | $5 \times 10^{18}$~$5 \times 10^{21}$ (preferably $1 \times 10^{19}$~$1 \times 10^{21}$) | SIMS |
| C concentration (atoms/cm$^3$) | $1 \times 10^{18}$~$5 \times 10^{19}$ (preferably $1 \times 10^{18}$~$2 \times 10^{19}$) | SIMS |

Figure 24:
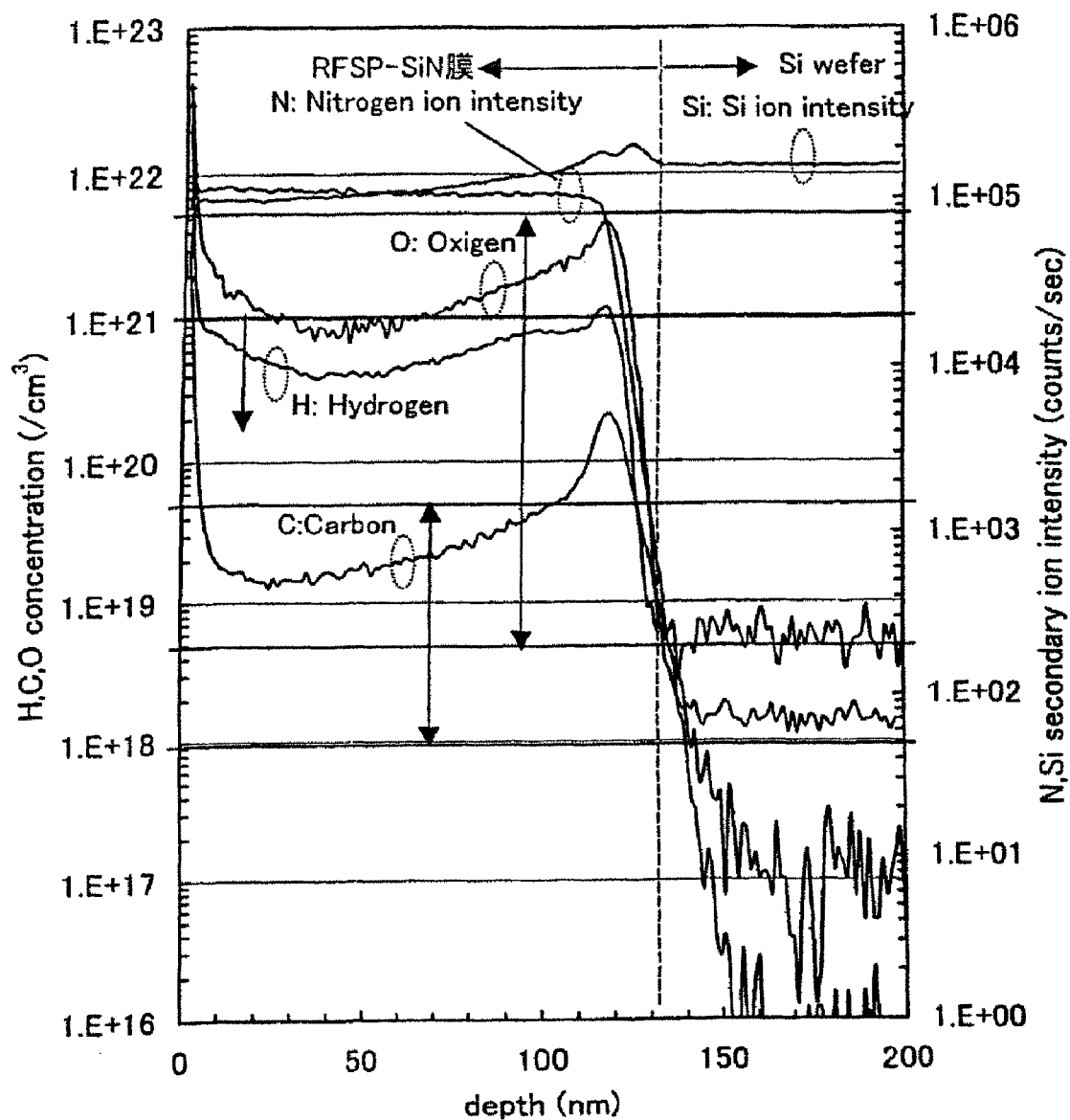
FIG. 24 is a graph which shows SIMS measurement data (secondary ion mass spectrometry) of the silicon nitride film.
Figure 25:
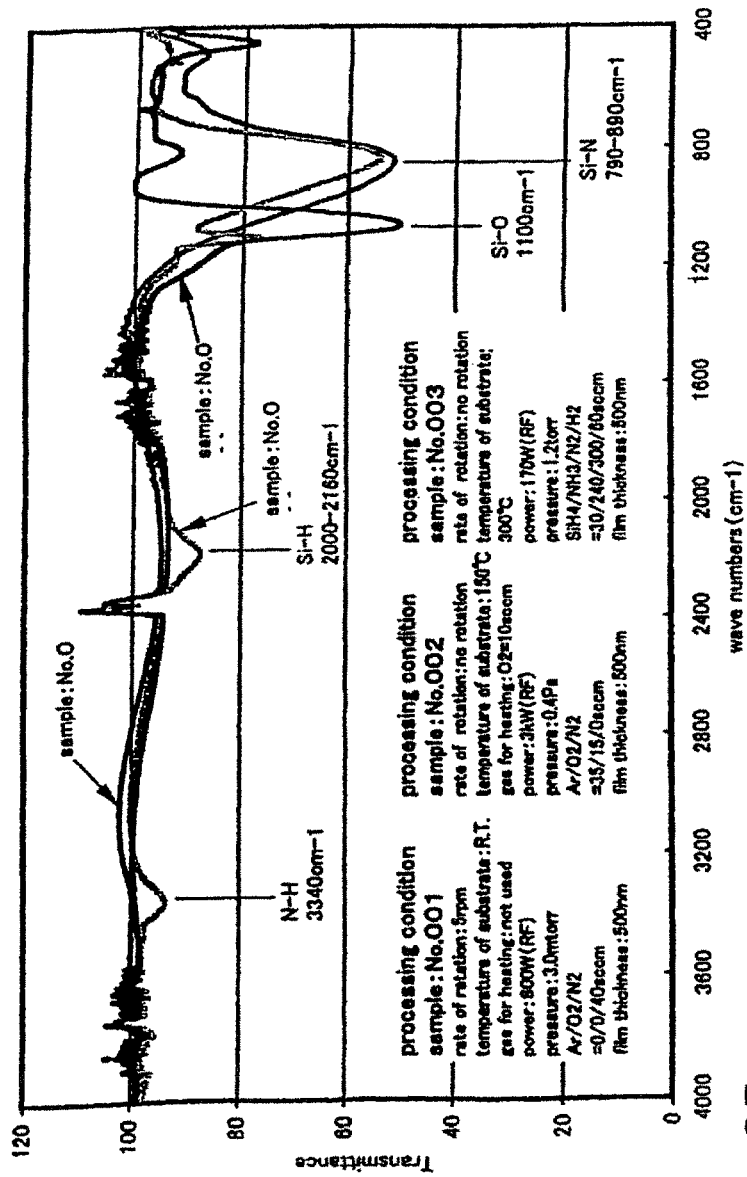
FIG. 25 is a graph which shows FT-IR measurement data of the silicon nitride film.
Figure 26:
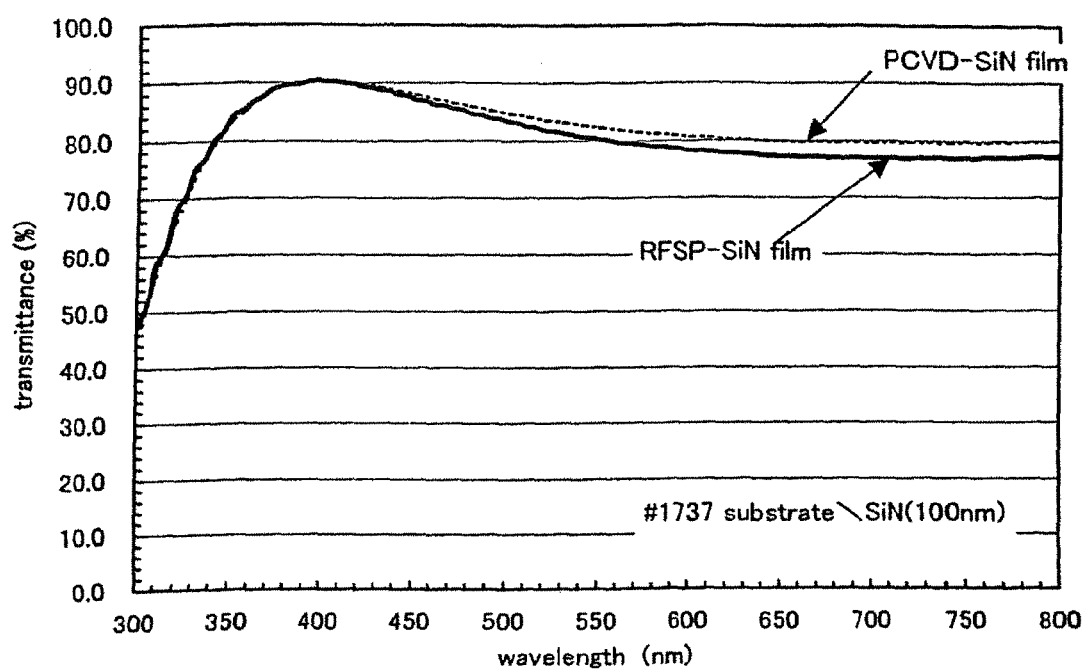
FIG. 26 is a graph which shows measurement of the transmittance of the silicon nitride film.

The results of the SIMS (secondary ion mass spectrometry) and FT-IR, and the transmittance, of the above silicon nitride film, are shown in FIGS. 24, 25 and 26, respectively. FIG. 26 also shows the silicon nitride film formed under the conditions of the table 2. The transmission factor is almost comparable to that of the conventional PCVD-SiN film.

The silicon nitride film used as an inorganic insulation layer according to the invention preferably satisfies the parameters shown in the table 4. That is, the inorganic insulation layer preferably satisfies one of the following conditions; (1) a silicon nitride film with etching rate of 9 nm/min or less (preferably, 0.5 to 3.5 nm/min or less), (2) hydrogen concentration of $1 \times 10^{21}$ atoms/cm$^3$ or less (preferably $5 \times 10^{20}$ atoms/cm$^3$ or less), (3) hydrogen concentration of $1 \times 10^{21}$ atoms/cm$^3$ or less (preferably $5 \times 10^{20}$ atoms/cm$^3$ or less), and oxygen concentration from $5 \times 10^{18}$ to $5 \times 10^{21}$ atoms/cm$^3$ (preferably $1 \times 10^{19}$ to $1 \times 10^{21}$ atoms/cm$^3$), (4) etching rate of 9 nm/min or less (preferably, 0.5 to 3.5 nm/min or less), and hydrogen concentration of $1 \times 10^{21}$ atoms/cm$^3$ or less (preferably $5 \times 10^{20}$ atoms/cm$^3$ or less), and (5) etching rate of 9 nm/min or less (preferably, 0.5 to 3.5 nm/min or less), hydrogen concentration of $1 \times 10^{21}$ atoms/cm$^3$ or less (preferably $5 \times 10^{20}$ atoms/cm$^3$ or less), and oxygen concentration from $5 \times 10^{18}$ to $5 \times 10^{21}$ atoms/cm$^3$ (preferably $1 \times 10^{19}$ to $1 \times 10^{21}$ atoms/cm$^3$).

The absolute value of the internal stress may be $2 \times 10^{10}$ dyn/cm$^2$ or less, preferably $5 \times 10^9$ dyn/cm$^2$ or less, and more preferably $5 \times 10^8$ dyn/cm$^2$ or less. The smaller internal stress can reduce the difference in the energy level between the films, and further prevent the film from peeling by the internal stress.

The silicon nitride film formed under condition shown in the Table 1 according to this embodiment has a distinct blocking effect against the elements belonging to Group 1 and Group 2 in the periodic table such as Na and Li, and can effectively suppress the diffusion of these mobile ions. For example, a metal film made of aluminum with 0.2 to 1.5 wt % (preferably, 0.5 to 1.0 wt %) lithium added is preferred for a cathode layer of this embodiment in terms of various physical characteristics including charge injection characteristic, or the like. However, when using this type of metal film, the lithium may diffuse and damage the performance of the transistor. To avoid this damage, the present embodiment completely protects the transistor with inorganic insulation layers, so that the lithium would not diffuse to the transistor.

Figure 27:
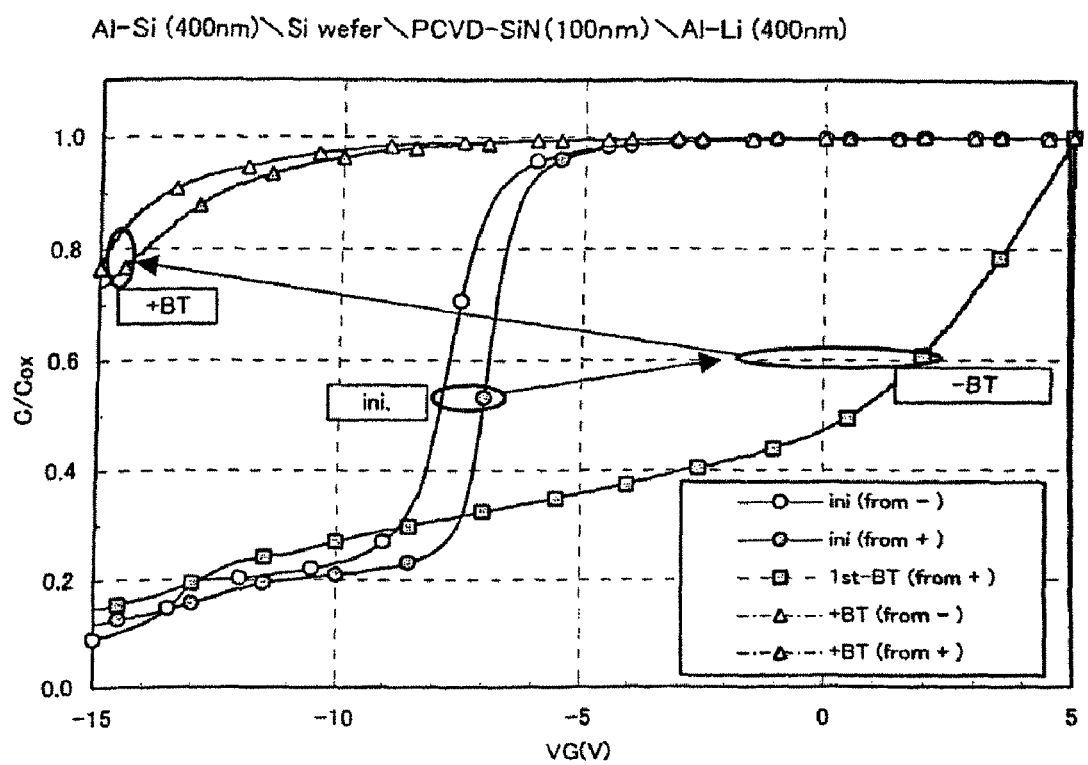
FIG. 27 is a graph which shows the C-V characteristics before and after the BT stress test of the MOS construction.

This is shown in the data in FIGS. 27 to 29. FIG. 27 is a diagram that shows the change in the C-V characteristic before and after the BT stress test of the MOS structure which has a silicon nitride film (PCVD-SiN film) as a dielectric formed under conditions of the table 2. The construction of the sample is shown in FIG. 29A, and the effect of the diffusion of the lithium can be determined by using Al—Li (lithium added aluminum) electrode as the surface electrode. As shown in FIG. 27, the B-T stress test reveals that the C-V characteristic is significantly shifted, which indicates that the lithium diffused from the surface electrode has a substantial effect.

Figure 28A:
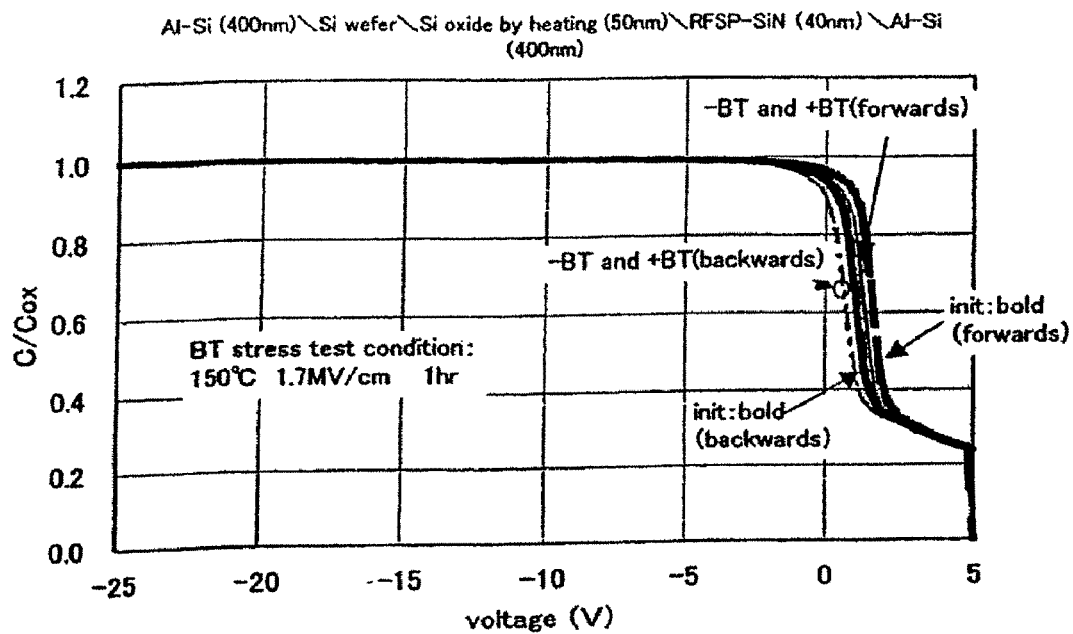
FIGS. 28A and 28B are graphs which show the C-V characteristics before and after the BT stress test of the MOS construction.
Figure 28B:
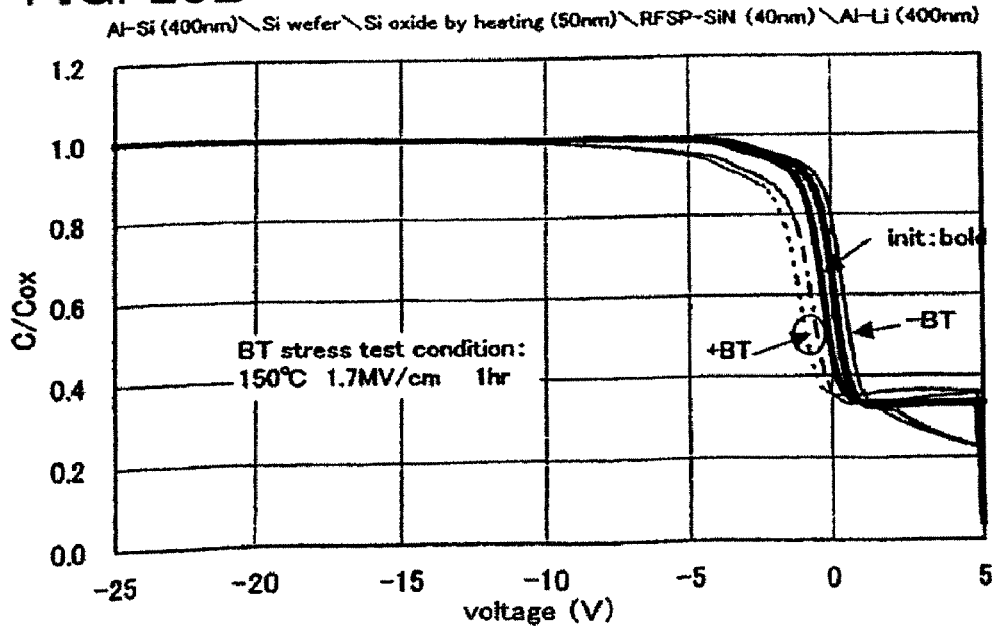

FIGS. 28A and 28B show the C-V characteristic before and after the BT stress test of the MOS structure which has a silicon nitride film (PCVD-SiN film) formed under conditions of the table 1 as a dielectric. The difference in the tests of FIG. 28A and FIG. 28B is that, an Al—Si (silicon added aluminum film) electrode is used as a surface electrode in the test of FIG. 28A, while an Al—Li (lithium added aluminum film) electrode is used as a surface electrode in the test of FIG. 28B. The result shown in FIG. 28B is the result of the measurement of the MOS construction shown in FIG. 29B. In FIG. 29B, the films are laminated with thermally-oxidized film in order to reduce the effect of difference in energy levels at the interface between the silicon nitride film and the silicon substrate.

As can be seen from the graphs in FIGS. 28A and 28B, the C-V characteristics before and after the BT stress test have similar shift pattern, which indicates that there is no effect of lithium diffusion, that is, the silicon nitride film formed under the conditions of the table 1 effectively serves as a blocking film.

As described, since the inorganic insulation layer used in this invention is extremely fine and has such high blocking effect against mobile elements including Na and Li, it can suppress diffusion of degassed components from the planarizing film as well as suppress the diffusion of Li from the Al—Li electrode. Taking advantage of these effects, a highly reliable display apparatus can be realized. The inventors suppose that the inorganic insulation layer can be made fine since silicon clusters cannot easily contaminate the film, as a thin silicon nitride film is formed on the surface of the single crystal silicon target, then the silicon nitride film thus manufactured is laminated on the substrate.

Also, as the silicon nitride film is formed by the sputtering method at relatively low temperature i.e., from the ambient temperature to about 200° C., the silicon nitride film which is used as a barrier film according to the invention can be formed on the resin films, which is another advantage over the plasma CVD method. The above silicon nitride film can be used as a part of a gate insulation film when forming it by laminating.

EMBODIMENTS

Embodiment 1

Next, the process of manufacturing the light emitting apparatus shown in FIG. 1 is described with reference to the figures.

In FIG. 8A, the substrate 101 may be one of a glass substrate, a quartz substrate or a ceramic substrate. The substrate 101 may comprise a silicon substrate, a metal substrate or a stainless substrate with an insulation layer formed thereon. A plastic substrate having heat resistance bearable to the processing temperature of the embodiment is acceptable.

A first inorganic insulation layer 102 consisting of an insulation film such as a silicon oxide film, a silicon nitride film or a silicon oxynitride film ($SiO_xN_y$) is formed on the substrate 101. A typical example has a two-layer construction, in which the first silicon oxynitride film of 50 nm thickness is formed using $SiH_4$, $NH_3$ and $N_2O$ as reaction gases, and the second silicon oxynitride film of 100 nm thickness is formed on the first film, using $SiH_4$ and $N_2O$ as reaction gases.

The semiconductor layer as an activation layer can be obtained by crystallizing the amorphous semiconductor film formed on the first inorganic insulation layer 102. The amorphous semiconductor film is formed with thickness of 30 to 60 nm, and crystallized by heating, or irradiating laser beams. There is no restriction on the material of the amorphous semiconductor film, however, silicon or silicon germanium ($Si_{1-x}Ge_x$; 0<x<1. Representative value for x is 0.001 to 0.05) alloy may be preferably used.

In a representative example, the amorphous silicon film of 54 nm thickness is formed by the plasma CVD method using $SiH_4$ gas. For crystallization, a pulse oscillating or a continuous oscillating excimer laser, or a YAG laser, a $YVO_4$ laser or a YLF laser which are doped with one of Cr, Nd, Er, Ho, Ce, Co, Ti or Tm can be used. When using one of a YAG laser, a $YVO_4$ laser or a YLF laser, the second harmonic to the fourth harmonic can be used. When using one of these lasers, the laser beam irradiated from the laser oscillator can be linearly collected by an optical system to irradiate on the semiconductor film. The condition of the crystallization can be selected by the operator appropriately.

In crystallization, certain metal element such as nickel which can serve as a catalyst for the crystallization of the semiconductor can be added. An exemplary process of crystallization is; holding a solution containing nickel on the amorphous silicon film, dehydrogenating (500° C. for one hour), heat-crystallizing (550° C. for four hours), then irradiating the second harmonic of a continuous oscillating laser selected from a YAG laser, a $YVO_4$ laser, or a YLF laser, in order to improve the crystallization.

Figure 12:
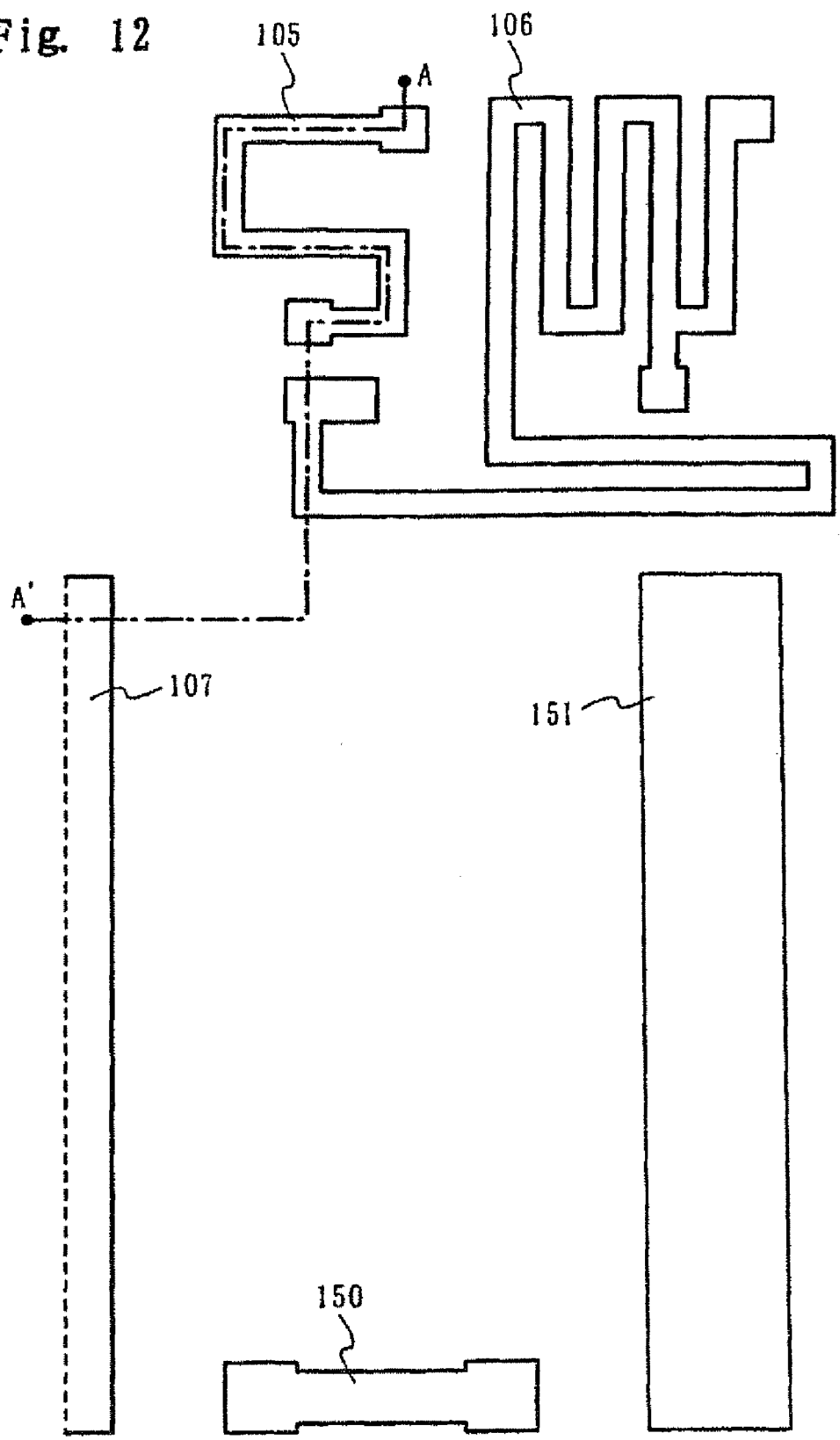
FIG. 12 is a top view which illustrates manufacturing processes of the light emitting apparatus according to the invention.

The resulting crystalline semiconductor film is etched in a desired form by photolithography using a photo mask (1) to form semiconductor layers 103 to 107 separated like islands. FIG. 12 shows a top view of the pixel at this point.

Also, after crystallization of the amorphous semiconductor film, the film can be doped with p-type impurity element in order to control threshold of the TFT. P-type impurity elements include the elements belonging to Group 13 in the periodic table, such as boron (B), aluminum (Al) and garium (Ga).

Next, as shown in FIG. 8B, a gate insulation film 108 covering the semiconductor layers 103 to 107 separated like islands is formed. The gate insulation film 108 of 40 to 150 nm thickness is formed by the plasma CVD method or the sputtering using inorganic insulation material such as silicon oxide or silicon oxynitride. This gate insulation layer can use insulation film containing silicon as a single layer construction or a laminated construction.

A first conductive film 10 of 10 to 50 nm thickness comprising tantalum nitride (TaN), and a second conductive film 11 of 100 to 400 nm thickness comprising tungsten (W) are laminated on the gate insulation film 108 in order to form a gate electrode. Other conductive material for gate electrode may be selected from Ta, W, Ti, Mo, Al, Cu, or an alloy or a chemical compound having one of above elements as a main component. Also, a semiconductor film including a polycrystalline silicon film doped with an impurity element such as phosphorous may be used. Furthermore, a combination of the first conductive film of a tantalum film (Ta) and the second conductive film of a W film, a combination of the first conductive film of a tantalum nitride (TaN) film and the second conductive film of a Al film, or a combination of the first conductive film of a tantalum nitride (TaN) film, and the second conductive film of Cu film may be also applied.

Next, as shown in FIG. 8C, a mask 12 by which gate electrode patterns are formed is formed by photolighography using a photo mask (2). After that, the first etching is performed with dry-etching, for example, ICP (Inductively Coupled Plasma) etching. There is no restriction on the etching gas, however, $CF_4$, $Cl_2$ and $O_2$ may be used for etching of W and TaN. In the first etching, predetermined biasing voltage is applied to the substrate to make inclination angle of 15 to 50 degrees on the side surface of the formed electrode patterns 13 to 17. The first etching facilitates simultaneous etching of the exposed region on this insulation film, and a region thinner than the other region by 10 to 30 nm is formed.

Figure 13:
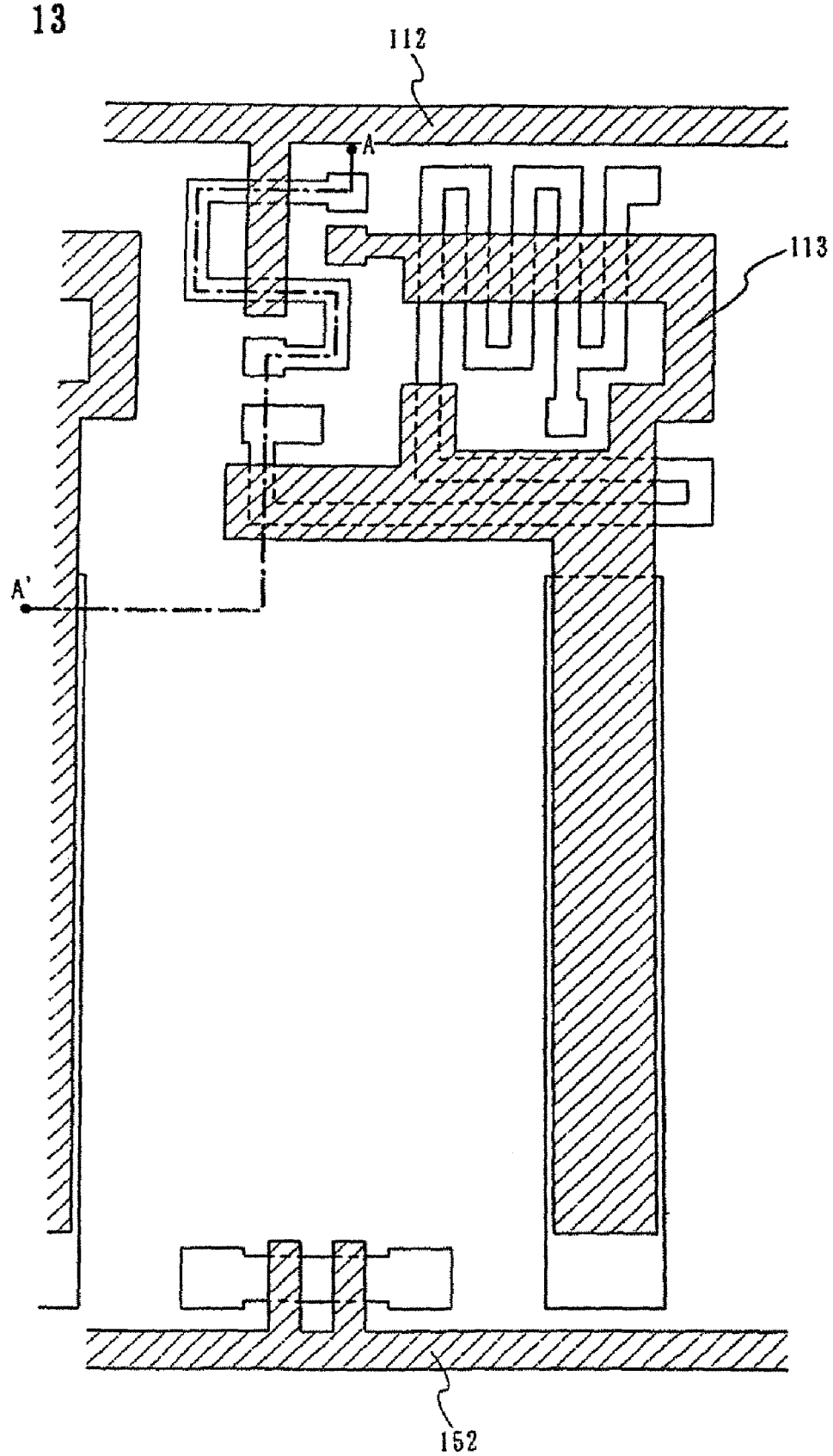
FIG. 13 is a top view which illustrates manufacturing processes of the light emitting apparatus according to the invention.

Next, the condition is changed to the second etching condition, and anisotropic etching is performed on the W film using $SF_6$, $Cl_2$ and $O_2$ as etching gases, and applying predetermined biasing voltage to the substrate. Gate electrodes 110 to 113 and a wiring 109 of an input terminal are thus formed. After that, the mask 12 is removed. The second etching facilitates simultaneous etching of the exposed region on this insulation film, and a region thinner than the other region by 10 to 30 nm is formed. FIG. 13 shows a top view of the pixel section at this point.

After formation of the gate electrodes, a first doping is performed as shown in FIG. 9A to form first n-type impurity regions 18 to 22 in the semiconductor layer. These first n-type impurity regions are formed in a self-aligned manner using the gate electrode as a mask. The doping condition can be set appropriately, using 5% $PH_3$ diluted with hydrogen, and injecting $6 \times 10^{13}/cm^2$ dose at 50 kV.

Next as shown in FIG. 9B, a mask 23 is formed by photolithography using a photo-mask (3) and a second doping is performed. The second doping uses 5% $PH_3$ diluted with hydrogen, and injects $3 \times 10^{15}$ atoms/$cm^2$ dose at 65 kV to form second n-type impurity regions 24, 25 and a third n-type impurity region 26. In the semiconductor layer 103, a second n-type impurity region 24 is formed outside of the gate electrode, and a third n-type impurity region 26 is formed in the position overlapping with the gate electrode, in a self-aligned manner using the gate electrode as a mask. The second n-type impurity region 25 is formed in the semiconductor layer 105 by the mask 23.

Next, as shown in FIG. 9C, a mask 27 is formed by photolithography using a photo-mask (4), and a third doping is performed. The third doping uses 5% $PH_3$ diluted with hydrogen, and injecting $2 \times 10^{16}$ atoms/$cm^2$ dose at 80 kV to form p-type impurity regions 28 to 30 in the semiconductor layers 104, 106 and 107.

As the result of the above processes, the impurity regions having either n-type conductivity or p-type conductivity are formed in each semiconductor layer, respectively. As shown in FIG. 10A, in the semiconductor layer 103, the second n-type impurity region 24 acts as a source or drain region, and the third n-type impurity region 26 acts as a LDD region. In the semiconductor layer 104, the p-type impurity region 28 acts as a source or drain region. In the semiconductor layer 105, the second n-type impurity region 25 acts as a source or drain region, and the first n-type impurity region 20 acts as a LDD region. In the semiconductor layer 106, the p-type impurity region 29 acts as a source or drain region.

Next, a second inorganic insulation layer 114 covering almost all the surface is formed. The second inorganic insulation layer 114 of 100 to 200 nm thickness is formed using the plasma CVD or the sputtering, with an inorganic insulation material containing silicon and hydrogen. The preferred example is an silicon oxynitride film of 100 nm thickness formed by the plasma CVD using $SiH_4$, $N_2O$, $NH_3$, and $H_2$. After that, heating at 410° C. for one hour is performed in nitrogen atmosphere. The purpose of this heating process is to hydrogenate the silicon oxynitride film in order to make it a source of the hydrogen.

Next, as shown in FIG. 10B, a first organic insulation layer 115 of 0.5 to 1 μm is formed on the second inorganic insulation layer 114. Thermosetting acrylic material can be used as the organic insulation material, which is spin-coated, then calcined at 250° C. to form planarized film. On this film, a third inorganic insulation layer 116 of 50 to 100 nm thickness is formed.

When forming the third inorganic insulation layer 116, the substrate having the second organic insulation layer 114 formed thereon is heated at 80 to 200° C. for dehydration. An exemplary material suitable for the third inorganic insulation layer 116 is silicon nitride film formed by sputtering using silicon as a target. Conditions for forming a film can be selected appropriately. Preferably, nitrogen ($N_2$) or mix of nitrogen and argon is applied by RF power for sputtering. The substrate may be processed in the temperature from room temperature to 200° C.

Next, as shown in FIG. 10C, mask patterns are formed by photolithography using photo-mask (5), and a contact hole 30 and an opening 31 of the input terminal are formed by dry-etching. The conditions of the dry-etching are as follows; etching the third inorganic insulation layer 116 and the first organic insulation layer 115 using $CF_4$, $O_2$ and He, then, etching the second inorganic insulation layer and the gate insulation layer using $CHF_3$.

Figure 14:
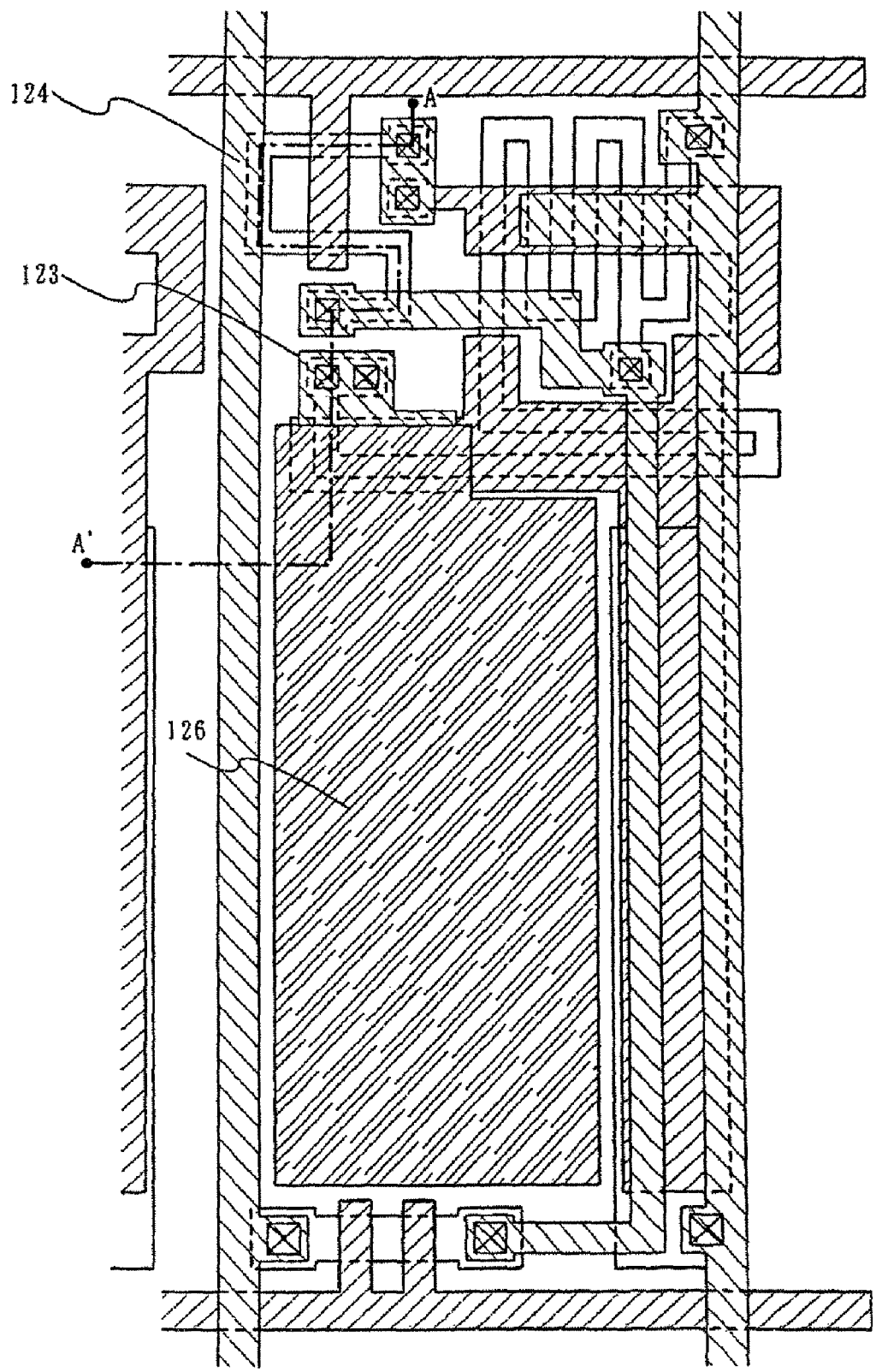
FIG. 14 is a top view which illustrates manufacturing processes of the light emitting apparatus according to the invention.

After that, as shown in FIG. 11A, wirings and pixel electrodes are formed using Al, Ti, Mo or W. A photo-mask (6) is used to form wirings. For example, a laminated film of a Ti film of 50 to 250 nm thickness and an alloy film comprising Al and Ti of 300 to 500 nm thickness may be used. The wirings 117 to 125 are thus formed. Then ITO of 30 to 120 nm thickness is formed by the sputtering, and then predetermined patterns are formed on it by photolithography using the photo mask (7). An anode layer 126 of the light emitting element is thus formed, and ITO film 127 is formed on the wiring at the input terminal. FIG. 14 shows the top view of the pixel at this stage.

Next, as shown in FIG. 11B, a second organic insulation layer 128 is formed. This layer is formed with acrylic material similar to the first organic insulation layer 115. Then, openings are formed using a photo-mask (8) over the anode layer 126, a connection of the cathode layer 310, and the input terminal. The second organic insulation layer 128 is formed so as to cover the end of the anode 126, and its side surface has an inclination angle of 40 degree.

The organic insulation material is hygroscopic and occludes moisture. In order to prevent the occlusion and release of moisture, a fourth inorganic insulation layer 129 of 10 to 100 nm thickness is formed on the second organic insulation layer 128. The fourth inorganic insulation layer 129 is formed with inorganic insulation material comprising nitride. The fourth inorganic insulation layer 129 is formed from a silicon nitride film manufactured by the sputtering. The applicable film is similar to that for the third inorganic insulation layer 116. The fourth inorganic insulation layer 129 covers the upper surface and the side surface of the second organic insulation layer 128, with a tapered end overlapping with the anode layer 126. Thus, the fourth inorganic insulation layer 129 is formed at the input terminal so as to cover the side surface of the opening formed over the second organic insulation layer 128, so that it prevents penetration of moisture from this region.

Then, an organic compound layer 130 containing light emitting material is formed. An cathode layer 131 is formed on the organic compound layer containing light emitting material, by the sputtering or resistance heating deposition. The cathode layer 131 is formed by using calcium fluoride or cesium fluoride as a cathode material and depositing it by vacuum deposition.

The cathode 131 is formed from laminated structure of lithium fluoride and aluminum. Noble gas (typically argon) is used for sputtering gas. Ions of sputtering gas are not only accelerated by sheath electric field and clash with a target, but also are accelerated by weak sheath electric field and implanted into the organic compound layer 130 containing a light emitting material under the anode. The noble gas prevents molecules or atoms from displacing by positioning between lattices of the organic compound layers and improves stability of the organic compounds. Further, the fifth inorganic insulation layer 132 formed on the anode 131 is formed of silicon nitride or DLC film. The ions of noble gas (typically argon) are accelerated by weak sheath electric field on the side of substrate an implanted into the organic compound layer 131 under the anode 131 passing through the anode. Then, an effect of improving stability of the organic compound can be obtained.

Finally, seal patterns are formed and a sealing plate is adhered to manufacture a light emitting apparatus as shown in FIG. 1.

Embodiment 2

This embodiment has a different construction than that of the embodiment 1 for the pixel section, as illustrated in FIGS. 31 and 32. In this embodiment, the processes from the beginning to the formation of the third inorganic insulation layer 116 wiring 123, and anode 126 are same as FIG. 1.

Figure 31A:
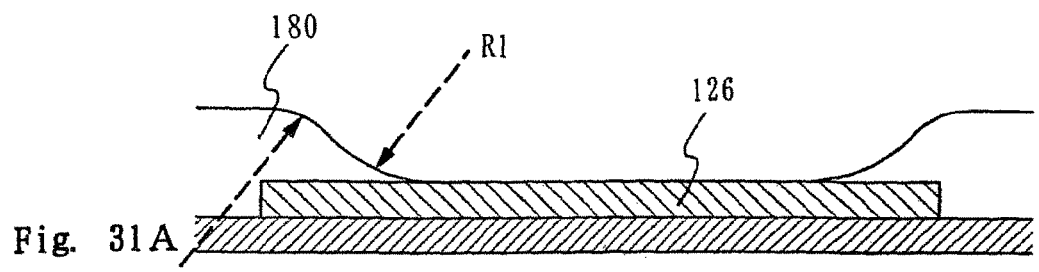
FIGS. 31A and 31B are cross-sectional views which illustrate the construction of the pixel section of the light emitting apparatus according to the invention.

As shown in FIG. 31A, a second organic insulation layer 180 covering the end of the anode 126 is formed of a photosensitive, negative-type acrylic resin. Thus, the end where the second organic insulation layer 180 contacts with the anode 126 has a inclined surface having a curvature as shown in Figure, the shape of which can be expressed by at least two curvatures R1 and R2. The center of the R1 is located above the wiring, while that of the R2 is located below the wiring. This shape may vary slightly depending on the exposure, but the thickness of the film is 1.5 μm and the value for R1 and R2 is 0.2 to 2 μm. The inclined surface has continuously varying curvatures.

Figure 31B:
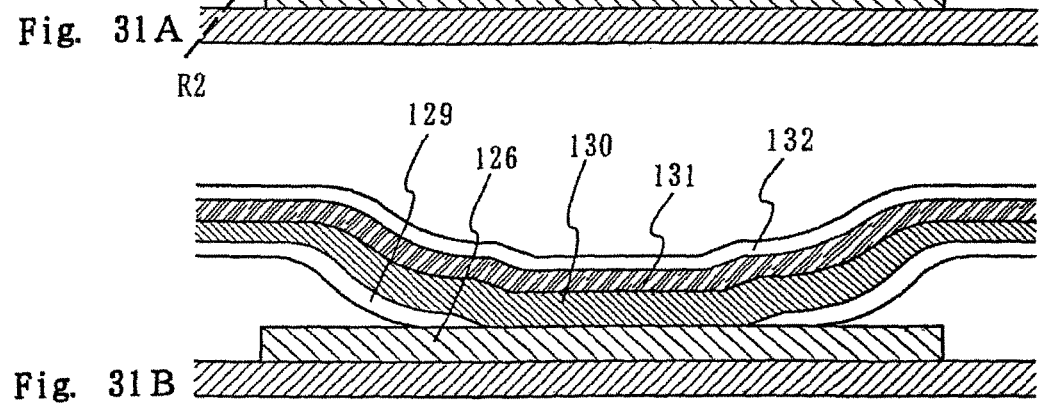

Then, along the inclined surface having these smooth curvatures, a fourth inorganic insulation layer 129, an organic compound layer 130, a cathode layer 131 and a fifth inorganic insulation layer 132 are formed as shown in FIG. 31B. The shape of the section of this second organic insulation layer 180 has an effect of mitigating stress (especially, a region where the anode 126, the fourth inorganic insulation layer 129 and the organic compound layer 130 overlap), which makes it possible to prevent the light emitting element from deteriorating from this end section. That is, this construction can prevent the progressive deterioration which begins from the peripheral of the pixel then expands to other region. In other words, a region not emitting light cannot expand.

Figure 32A:
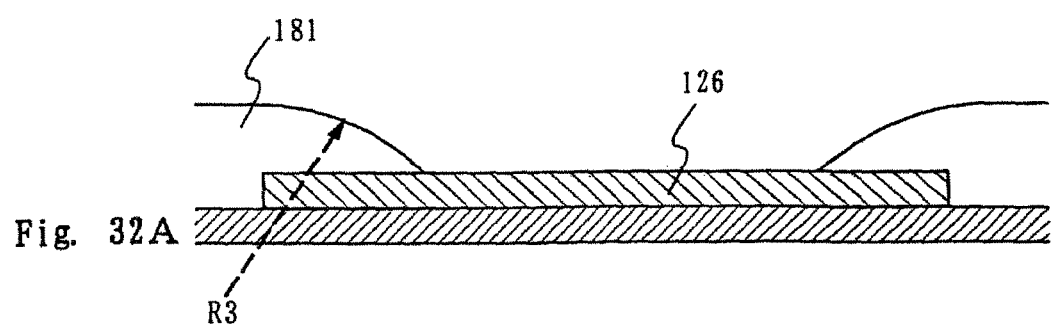
FIGS. 32A and 32B are cross-sectional views which illustrate the construction of the pixel section of the light emitting apparatus according to the invention.
Figure 32B:
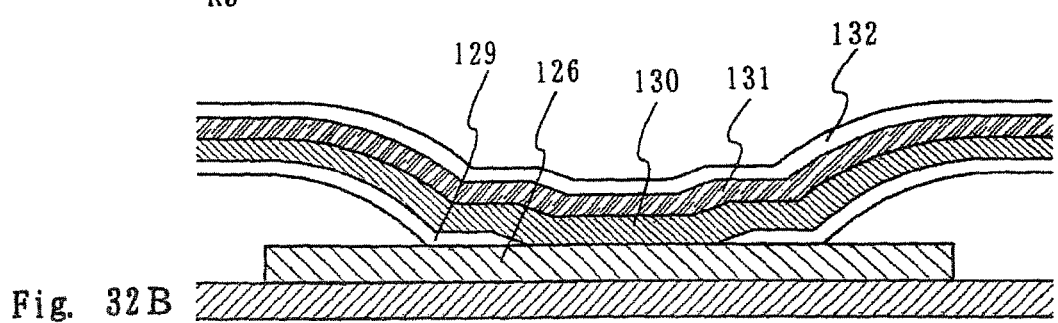

FIG. 32A shows an example wherein the second organic insulation layer 181 is formed with a photosensitive positive-type acrylic resin instead of the photosensitive negative-type acrylic resin. In this case, the shape of the section at the end is different. The curvature radius R3 is 0.2 to 2, with its center located below the anode layer 126. After formation of the second organic insulation layer 181, a fourth inorganic insulation layer 129, an organic compound layer 130, an cathode layer 131 and a fifth inorganic insulation layer 132 are formed along the inclined surface having curvatures as shown in FIG. 32B. The similar effect can be obtained by this construction.

This embodiment can be implemented in combination with the embodiments 1 and 2.

Embodiment 3

For the embodiments 1 to 2, there is no restriction on the construction of the organic compound layer in the light emitting element 309, so that, any known construction is applicable. The organic compound layer 130 has a light emitting layer, a positive holes injecting layer, an electrons injecting layer, a positive holes transferring layer and an electrons transferring layer, and may have a construction wherein these layers are laminated, or a construction wherein a part or all of the materials forming these layers are mixed. Particularly, the light emitting layer, the positive holes injecting layer, the electrons injecting layer, the positive holes transferring layer and the electrons transferring layer are included. A basic EL element has a construction wherein an anode, a light emitting layer, a cathode are laminated in this order. Other possible construction includes a construction wherein the layers are laminated in an order of an anode, a positive holes injection layer, a light emitting layer and a cathode, or an order of an anode, a positive holes injecting layer, a light emitting layer, an electrons transferring layer and a cathode.

Typically, the light emitting layer is formed using organic compound. However, it may be formed with charge injection transferring material including organic compound or inorganic compound and a light emitting material, it may contain one or more layers made of organic compound selected from low molecular organic compounds, middle molecular organic compounds, and polymer organic compounds, and the light emitting layer may be combined with inorganic compound of an electrons injection transferring type or a positive holes injection transferring type. The middle molecular organic compounds refer to organic compounds which are not sublimatic and have molecular numbers of 20 or less, or length of catenated molecules does not exceed 10 μm.

The applicable light emitting materials include metal complex such as tris-8-quinolinolatoaluminum complex or bis(benzoquinolinolato)beryllium complex as low molecular organic compounds, phenylanthracene derivative, tetraaryldiamine derivative and distyrylbenzen derivative. Using one of the above materials as a host substance, coumarin derivative, DCM, quinacridone and rubrene may be applied. Other known materials may be applicable as well. Polymer organic compounds include polyparaphenylenevinylenes, polyparaphenylens, polythiophenes and polyfluorenes, including, poly(p-phenylene vinylene): (PPV), poly(2,5-dialkoxy-1,4-phenylene vinylene): (RO-PPV), poly[2-(2'-ethylhexoxy)-5-methoxy-1,4-phenylene vinylene]: (MEH-PPV), poly(2-(dialkoxyphenyl)-1,4-phenylene vinylene): (ROPh-PPV), poly(p-phenylene): (PPP), poly(2,5-dialkoxy-1,4-phenylene): (RO-PPP), poly(2,5-dihexoxy-1,4-phenylene), polythiophene: (PT), poly(3-alkylthiophene): (PAT), poly(3-hexylthiophene): (PHT), poly(3-cyclohexylthiophene): (PCHT), poly(3-cyclohexyl-4-methylthiophene): (PCHMT), poly(3,4-dicyclohexylthiophene): (PDCHT), poly(3-(4-octylphenyl)-thiophene): (POPT), poly[3-(4-octylphenyl)-2,2-bithiophene]): (PTOPT), polyfluorene: (PF), poly(9,9-dialkylfluorene): (PDAF), poly(9,9-dioctylfluorene): (PDOF).

Inorganic compounds, such as diamond-like carbon (DLC), Si, Ge and oxides and nitrides thereof, may be used for the charge injection transferring layer. The above materials may furthermore be added with P, B or N appropriately. Also, the charge injection transferring layer may be oxides, nitrides or fluorides of alkali metals or alkali earth metals, or compounds or alloys of the alkali metals or alkali earth metals with at least Zn, Sn, V, Ru, Sm and In.

The listed materials are only examples. By using these materials, functional layers such as a positive holes injection transferring layer, a positive holes transferring layer, electrons injection transferring layer, an electrons transferring layer, a light emitting layer, an electron block layer and a positive holes block layer can be manufactured and laminated appropriately to form a light emitting element. Also, a mixed layer or a mixed connection which combines these layers may be formed, as well. The electroluminescence has two types of light, i.e. a light which is emitted when the state moves back from singlet excited state to the ground state (fluorescence), and a light which is emitted when the state moves back from triplet excited state to the ground state (phosphorescence). The electroluminescence element according to the invention can use either or both of these lights.

This embodiment can be implemented in combination with embodiments 1 to 3.

Embodiment 4

The anode layer 126 and the cathode layer 131 of the light emitting element 309 in the embodiment 1 can be reversed. In this case, the layers are laminated in the order of the cathode layer 126, the organic compound layer 130 and the anode layer 131. In place of ITO, Metal nitride (titanium nitride, for example) with a work function of 4 eV or more formed with a thickness of 10 to 30 nm to have translucency also can be used for the cathode layer 126. Further, the cathode layer 131 can be formed from the lithium fluoride layer of 0.5 to 5 nm thickness on an aluminum layer of 10 to 30 nm thickness.

This embodiment can be implemented in combination with the embodiments 1 to 4.

Embodiment 5

Figure 18:
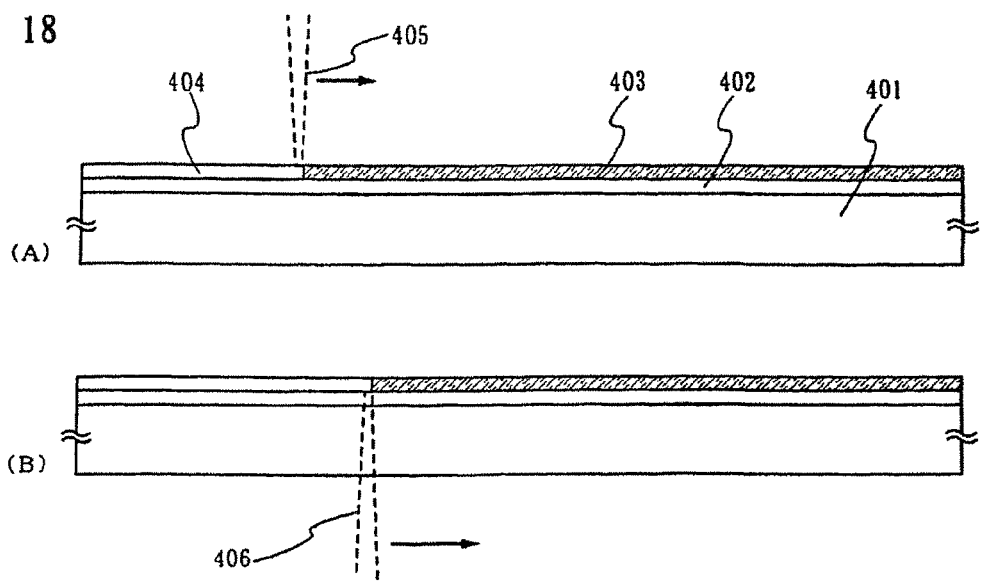
FIG. 18 shows an example of a process to manufacture semiconductor layers to be adopted in the TFT constituting the light emitting apparatus according to the invention.

An embodiment of manufacturing process of the semiconductor layer to be applied to the TFT in the embodiment 1 will be described with reference to FIG. 18. In this embodiment, continuous oscillating laser beams scan the amorphous silicon film formed on the insulation surface to crystallize the same.

A barrier layer 402 comprising a silicon oxynitride film of 100 nm thickness is formed on a glass substrate 401, as shown in FIG. 18A. On the barrier layer 902, an amorphous silicon film 403 of 54 nm thickness is formed by the plasma CVD method.

The laser beams are continuous beams irradiated with continuous oscillation from an Nd:YVO$_4$ laser oscillator, and the second harmonic (532 nm) obtained by a wavelength conversion element is irradiated. The continuous oscillating laser beams are collected in an oblong shape by an optical system, and by moving relative positions of the substrate 401 to the point from which the laser irradiate the beam 405, the amorphous silicon film 403 is crystallized to form a crystalline silicon film 404. F20 cylindrical lens can be adopted as the optical system, which transforms the laser beam with a diameter of 2.5 mm into an oblong shape with long axis of 2.5 mm and short axis of 20 µm on the irradiated surface.

Of course, other laser oscillator may equally be applicable. As a continuous solid-state laser oscillator, a laser oscillator using a crystal such as YAG, YVO$_4$, YLF or YAlO$_3$, doped with Cr, Nd, Er, Ho, Ce, Co, Ti or Tm may be applicable.

When using the second harmonic (532 nm) of the Nd:YVO$_4$ laser oscillator, the laser beam of the wavelength is transmitted through the glass substrate 401 and the barrier layer 402. Therefore, the laser beam 406 may be irradiated from the glass substrate 401 side, as shown in FIG. 18B.

Crystallization proceeds from the area to which the laser beam 405 is irradiated, to form a crystalline silicon film 404. The laser beam may be scanned in either one direction or backwards and forwards. When scanning backwards and forwards, the laser energy density may be changed for each scanning to make gradual crystallization. The scanning may have dehydrogenation effect as well, which is often necessary when an amorphous silicon film is to be crystallized. In that case, the first scanning may be performed at lower energy density, then, after dehydrogenation, the second scanning may be performed at higher energy density to complete the crystallization. Such process can also provide a crystalline semiconductor film in which crystal grains extend in the direction of laser beam scanning. After these processes, semiconductor layers are separated like islands, which can be applied to the embodiment 1.

The construction shown in this embodiment is only exemplary. Other laser oscillator, other optical system and combination thereof may be applicable as long as similar effect can be obtained.

Embodiment 6

Figure 19:
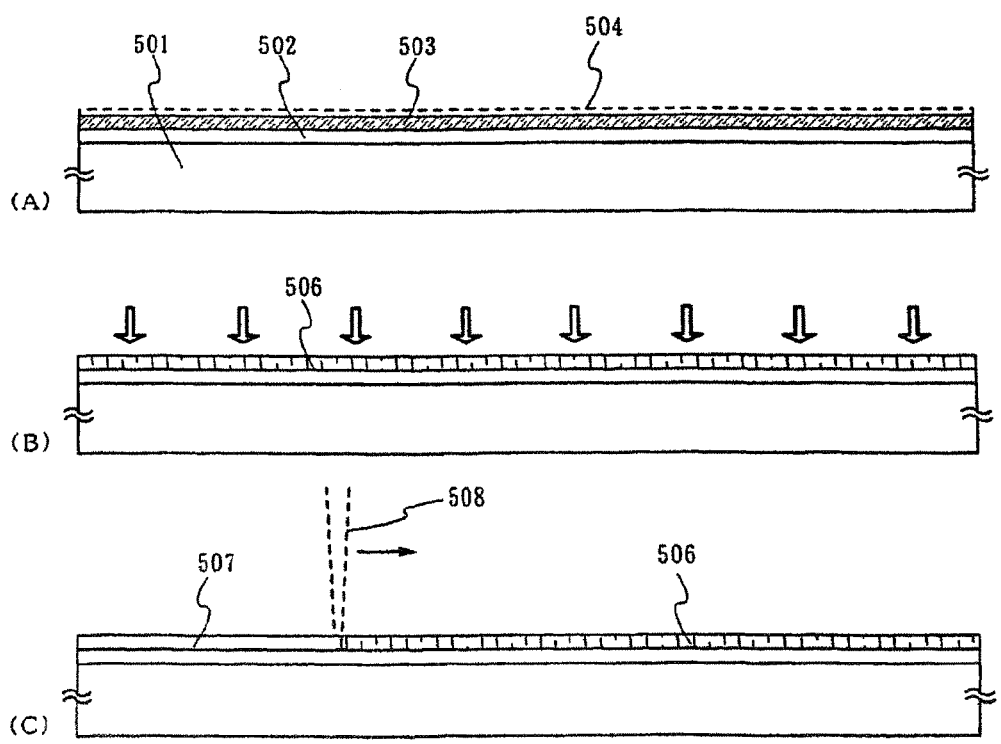
FIG. 19 shows an example of a process to manufacture semiconductor layers to be adopted in the TFT constituting the light emitting apparatus according to the invention.

An embodiment of manufacturing process of the semiconductor layer to be applied to the TFT in the embodiment 1 will be described with reference to FIG. 19. In this embodiment, an amorphous silicon film formed on the insulation surface is crystallized in advance, then, expanding the size of the crystal grains by continuous oscillating laser beams.

As shown in FIG. 19A, a blocking layer 502 and an amorphous silicon film 503 are formed on a glass substrate 501 as is in the embodiment 1. Nickel acetate 5 ppm solution is spin-coated to form a catalyst element containing layer 504 in order to add Ni as a metal element to lower the crystallization temperature and promote the crystallization.

The amorphous silicon film is crystallized by heating at 580° C. for four hours, as shown in FIG. 19B. Silicide is formed and diffused in the amorphous silicon film by the action of Ni, and the crystal grows simultaneously. The resultant crystalline silicon film 506 consists of bar-shaped or needle-shaped crystals, each of which grows in specific direction when seen from a macroscopic viewpoint, thus the crystalline directions are uniform. And, it is characterized by that a plane (110) has a high orientation rate.

As shown in FIG. 19C, scanning by continuous oscillating laser beam 508 is performed to improve the quality of the crystallization of the crystalline silicon film 506. By irradiating the laser beam, the crystalline silicon film melts and re-crystallize. In this re-crystallization, the crystal grains extend in the scanning direction of the laser beam. As the surface of the crystalline silicon film is uniform, it is possible to suppress deposition of crystalline grains with different crystalline plains and formation of dislocations. After these processes, semiconductor layers are separated like islands, which can be applied to the embodiment 1.

Embodiment 7

Figure 20:
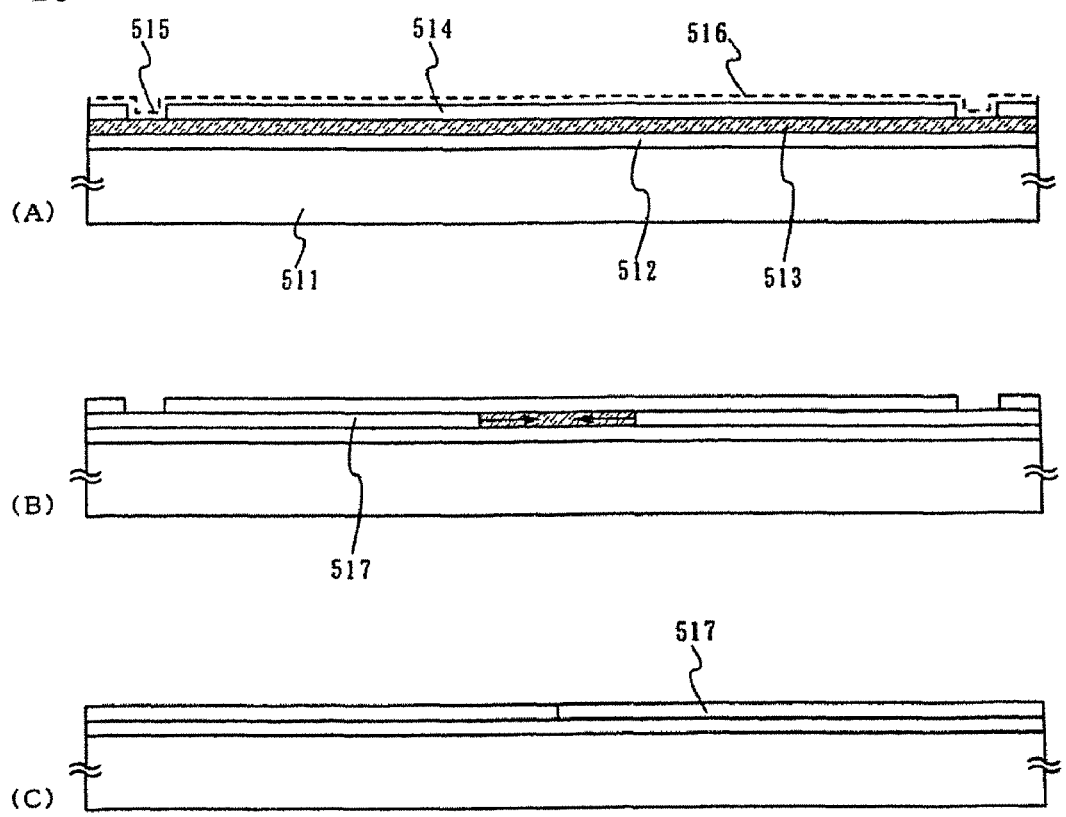
FIGS. 20A to 20C show an example of a process to manufacture semiconductor layers to be adopted in the TFT constituting the light emitting apparatus according to the invention.

An embodiment of manufacturing process of the semiconductor layer which can be applied to the TFT in the embodiment 1 will be described with reference to FIG. 20.

As shown in FIG. 20A, a blocking layer 512 and an amorphous silicon film 513 are formed on a glass substrate 511 as is in the embodiment 1. On this film, a silicon oxide film of 100 nm thickness is formed as a mask insulation film 514 by plasma CVD, and an opening 515 is provided. The nickel acetate 5 ppm solution is spin-coated in order to add Ni as a catalyst element. Ni solution contacts with the amorphous silicon film at the opening 515.

Next, as shown in FIG. 20B, the amorphous silicon film is crystallized by heating at 580° C. for four hours. By the action of the catalyst element, the crystal grows from the opening 515 in a direction parallel to the surface of the substrate. The resultant crystalline silicon film 517 consists of bar-shaped or needle-shaped crystals, each of which grows in specific direction when seen from a macroscopic viewpoint, thus the crystalline directions are uniform. Also, it is oriented in a specific direction.

After heating, the mask insulation film 514 is removed by etching to obtain a crystalline silicon film 517 as shown in FIG. 20C. After these processes, semiconductor layers are separated like islands, which can be applied to the embodiment 1.

Embodiment 8

In the embodiment 6 or 7, after the formation of the crystalline silicon film 507 or 517, a process can be added to remove the catalyst element remaining in the film with concentration of $10^{19}$ atoms/cm$^3$ or more, by gettering.

Figure 21:
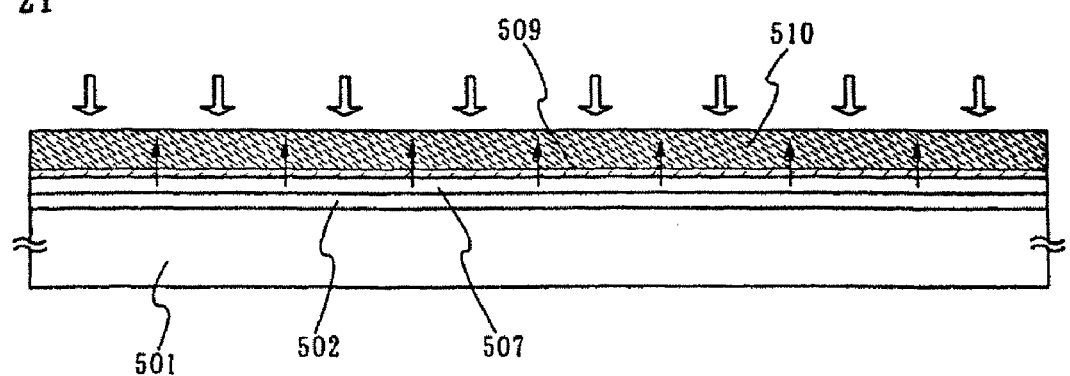
FIG. 21 shows an example of a process to manufacture semiconductor layers to be adopted in the TFT constituting the light emitting apparatus according to the invention.

As shown in FIG. 21, a barrier layer 509 comprising thin silicon oxide film is formed on the crystalline silicon film 507, then an amorphous silicon film added with argon or phosphorous of $1 \times 10^{20}$ atoms/cm$^3$ to $1 \times 10^{21}$ atoms/cm$^3$ is formed by the sputtering, as a gettering site 510.

The Ni which is added as a catalyst element can be segregated to the gettering site 510, by heating at 600° C. for 12 hours in a furnace anneal, or by heating at 650 to 800° C. for 30 to 60 minutes with RTA using lamp light or heated gas. This process reduces the concentration of the catalyst element in the crystalline silicon film 507 to $10^{17}$ atoms/cm$^3$ or less.

The gettering under similar condition is effective for the crystalline silicon film formed in the embodiment 5. The minute amount of the metal element contained in the crystalline silicon film formed by irradiating laser beams to the amorphous silicon film can be removed by this gettering.

Embodiment 9

Figure 23A:
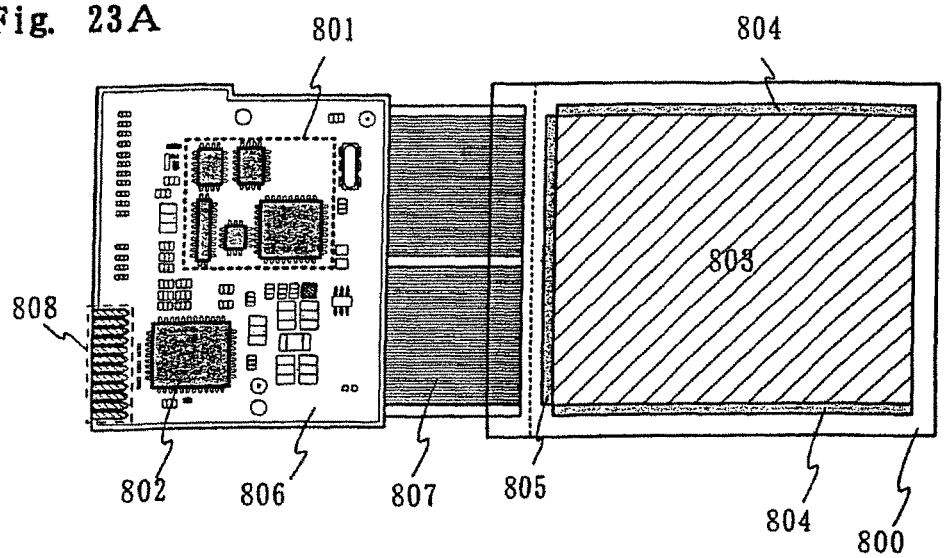
FIGS. 23A and 23B show one construction of the EL module.

FIG. 23 shows an embodiment to make a module from an EL panel in which the pixel section and the driving circuit section are integrally formed on the glass substrate, as shown in the embodiment 1. FIG. 23A illustrates an EL module on which an IC containing a power supply circuit for example is mounted on the EL panel.

In FIG. 23A, the EL panel 800 is provided with a pixel section 803 having a light emitting element for each pixel, a scanning line driving circuit 804 for selecting a pixel in the pixel section 803, and a signal line driving circuit 805 for supplying video signals to the selected pixel. Also, a print substrate 806 is provided with a controller 801 and a power supply circuit 802. Various signals and power supply voltage output from the controller 801 or a power supply circuit 802 are supplied to the pixel section 803, the scanning line driving circuit 804 and the signal line driving circuit 805 of the EL panel 800 via FPC 807.

The power supply voltage and various signals to the print substrate 806 are supplied via an interface (I/F) section 808 on which a plurality of input terminals are disposed. In this embodiment, the print substrate 806 is mounted on the EL panel 800 using FPC, but the invention is not limited to this particular construction. The controller 801 and the power supply circuit 802 may be mounted directly on the EL panel 800 using COG (Chip on Glass) technique. In the print substrate 806, noises may be introduced in the power supply voltage or the signals due to the capacity formed in the wirings or the resistance of the wirings itself, which may prevent sharp rising edge of a signal. In order to avoid this problem, the print substrate 806 may be provided with elements such as a capacitor or a buffer, to prevent noises on the power supply voltage or signals, and to keep sharp rising edge of the signal.

Figure 23B:
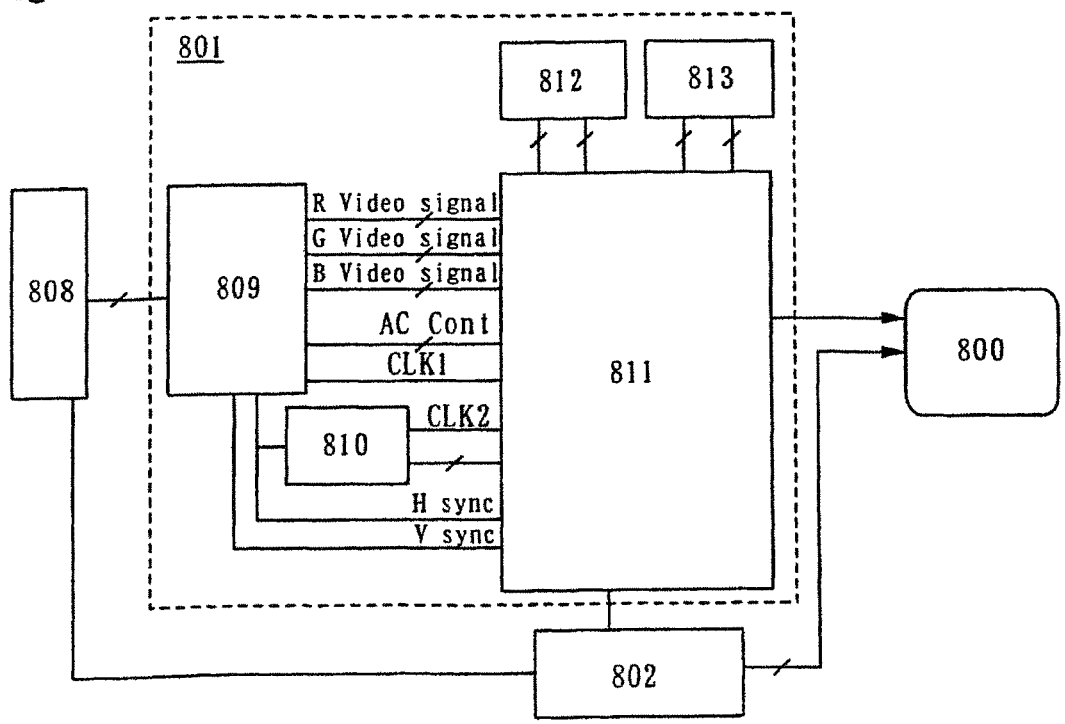

FIG. 23B is a block diagram which shows a construction of the print substrate 806. The various signals and the power supply voltage supplied to the interface 808 are supplied to the controller 801 and the power supply voltage 802. The controller 801 has an A/D converter 809, a PLL (phase locked loop) 810, a control signal generator 811 and SRAMs (Static Random Access Memory) 812 and 813. Although this embodiment uses SRAMs, SDRAMs or DRAMs (Dynamic Random Access Memory, provided that it can read/write data at high speed) may be used as well.

The video signals supplied via the interface 808 are converted from parallel form to serial form by the A/D converter 809, and input into the control signal generator 811, as video signals each of which corresponds to R, G, B colors, respectively. Based on the signals supplied via the interface 808, the A/D converter 809 generates Hsync signals, Vsync signals, clock signal CLKs, and volts alternating current [VAC], all of which are input into the control signal generator 811.

The phase locked loop 810 is able to make the phases of the frequencies of the various signals supplied via the interface 808 to be matched to that of the operating frequency of the control signal generator 811. The operating frequency of the control signal generator 811 is not always same as the frequency of the various signals supplied via the interface 808, so that the phase locked loop 810 adjusts the operating frequency of the control signal generator 811 to make the frequency synchronized with that of the signals. The video signal which is input into the control signal generator 811 is temporarily written and stored in the SRAMs 812 and 813. From all of the video signal bits stored in the SRAM 812, the control signal generator 811 reads the video signal corresponding to the all pixels by one bit at a time, and supplies the bit to the signal line driving circuit 805 of the EL panel 800.

The control signal generator 811 supplies information related to the period during which the light emitting element emits light for each bit, to the scanning line driving circuit 804 of the EL panel 800. The power supply circuit 802 supplies the predetermined power supply voltage to the signal line driving circuit 805, the scanning line driving circuit 804 and the pixel section 803, of the EL panel 800.

FIG. 22 shows examples of electronic apparatuses in which the above EL module may be incorporated.

Figure 22A:
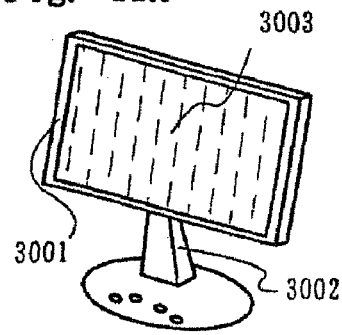
FIGS. 22A to 22G are views which show applications of the invention.

FIG. 22A is an example of a television receiver in which the EL module is incorporated, comprising a casing 3001, a support 3002 and a display unit 3003. The TFT substrate manufactured according to the invention is adopted in the display unit 3003 to complete the television receiver.

Figure 22B:
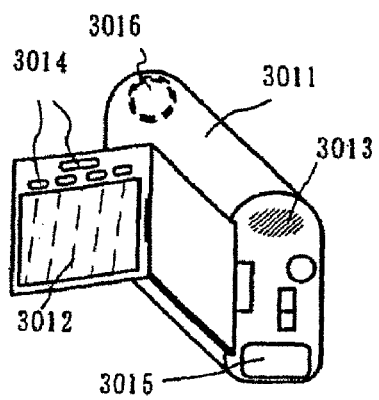

FIG. 22B is an example of a video camera in which the EL module is incorporated, comprising a body 3011, a display unit 3012, a sound input 3013, an operating switch 3014, a battery 3015 and an image receiving section 3016. The TFT substrate manufactured according to the invention is adopted in the display unit 3012 to complete the video camera.

Figure 22C:
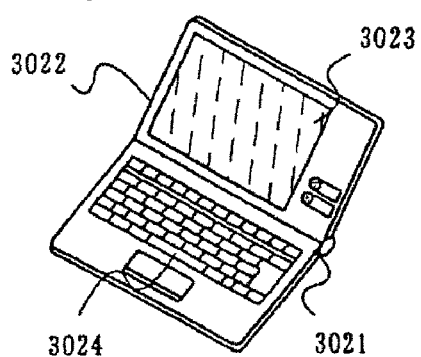

FIG. 22C is an example of a notebook-type personal computer in which the EL module is incorporated, comprising a body 3021, a casing 3022, a display unit 3023 and a keyboard 3024. The TFT substrate manufactured according to the invention is adopted in the display unit 3023 to complete the personal computer.

Figure 22D:
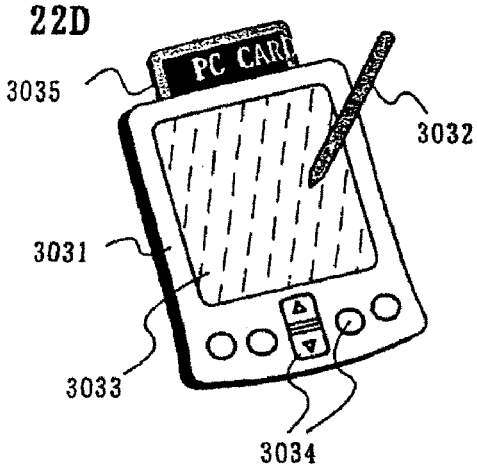

FIG. 22D is an example of FDA (Personal Digital Assistant) in which the EL module is incorporated, comprising a body 3031, a stylus 3032, a display unit 3033, an operating button 3034 and an external interface 3035. The TFT substrate manufactured according to the invention is adopted in the display unit 3033 to complete the PDA.

Figure 22E:
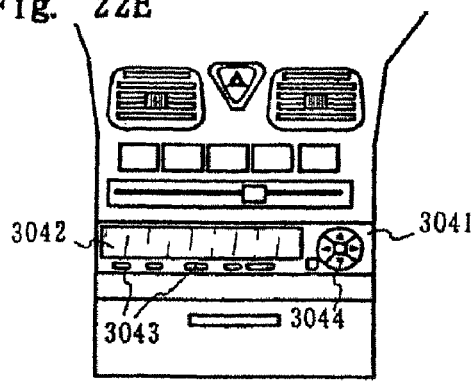

FIG. 22E is an example of an car audio system in which the EL module is incorporated, comprising a body 3041, a display unit 3042 and operating switches 3043 and 3044. The TFT substrate manufactured according to the invention is adopted in the unit display 3042 to complete the car audio system.

Figure 22G:
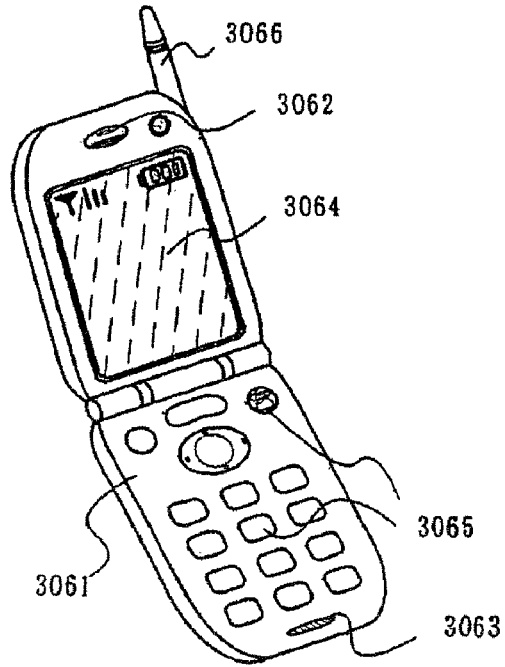
Figure 22F:
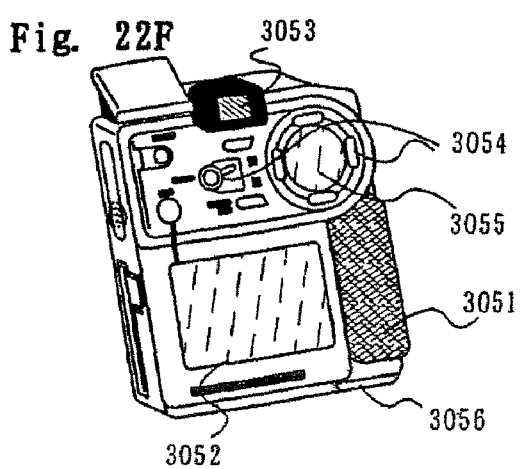

FIG. 22F is an example of a digital camera in which the EL module is incorporated, comprising a body 3051, a display unit (A) 3052, an eyepiece 3053, an operating switch 3054, a display unit (B) 3055 and a battery 3056. The TFT substrates manufactured according to the invention are adopted to the display units (A) 3052 and (B) 3055 to complete the digital camera.

FIG. 22G is an example of a mobile telephone in which the El module is incorporated, comprising a body 3061, a voice output section 3062, a voice input section 3063, a display unit 3064, an operating switch 3065 and an antenna 3066. The TFT substrate manufactured according to the invention is adopted to the display unit 3064 to complete the mobile telephone.

The application of the invention is not limited to the apparatuses shown in this figure. Instead, it can be adopted in a variety of electronics.

According to the invention, the semiconductor film, the gate insulation film and the gate electrode, which are the main components of a TFT, are surrounded by inorganic insulation materials over their upper surfaces and under their lower surfaces to prevent contamination by alkali metals and organic materials. The inorganic insulation material is selected from a group consisting of silicon nitride, silicon oxynitride, aluminum oxynitride, aluminum oxide and aluminum nitride. The organic light emitting element contains alkali metal in its part, and surrounded by inorganic insulation material to realize a construction which can prevent penetration of oxygen or moisture from external world. The inorganic insulation material is selected from a group consisting of silicon nitride, silicon oxynitride, aluminum oxynitride, aluminum nitride and DLC. This construction can improve the reliability of the light emitting apparatus.

What is claimed is:

1. A display device comprising:
a terminal comprising a first conductive layer and a second conductive layer over a substrate;
an insulating layer over the second conductive layer; and
an organic compound layer containing light emitting material over the insulating layer,
wherein the second conductive layer comprises oxide conductive material,
wherein the insulating layer is in direct contact with the organic compound layer containing light emitting material and the second conductive layer, and
wherein a length of the first conductive layer extended from an edge of the substrate is larger than a length of the second conductive layer extended from the edge of the substrate.

2. The display device according to claim 1,
wherein the substrate comprises an organic resin substrate.

3. The display device according to claim 1,
wherein the insulating layer comprises an inorganic insulation material.

4. The display device according to claim 3,
wherein the inorganic insulation material is selected from the group consisting of a silicon nitride, an aluminum nitride, and an aluminum oxynitride.

5. The display device according to claim 1,
wherein the organic compound layer containing light emitting material comprises one or more layers.

6. The display device according to claim 1,
wherein the oxide conductive material is ITO.

7. A display device comprising:
a terminal comprising a first conductive layer and a second conductive layer over a substrate;
a first insulating layer over the second conductive layer;
a second insulating layer over the first insulating layer; and
an organic compound layer containing light emitting material over the second insulating layer,
wherein the second conductive layer comprises oxide conductive material,
wherein part of the second conductive layer is covered with the first insulating layer,
wherein the first insulating layer comprises an organic insulating layer, and
wherein the second insulating layer is in direct contact with the organic compound layer containing light emitting material and the second conductive layer.

8. The display device according to claim 7,
wherein the substrate comprises an organic resin substrate.

9. The display device according to claim 7,
wherein a length of the first conductive layer extended from an edge of the substrate is larger than a length of the second conductive layer extended from the edge of the substrate.

10. The display device according to claim 7,
wherein the first insulating layer comprises a thermosetting material.

11. The display device according to claim 7,
wherein the second insulating layer comprises an inorganic insulation material.

12. The display device according to claim 11,
wherein the inorganic insulation material is selected from the group consisting of a silicon nitride, an aluminum nitride, and an aluminum oxynitride.

13. The display device according to claim 7,
wherein the organic compound layer containing light emitting material comprises one or more layers.

14. The display device according to claim 7,
wherein the oxide conductive material is ITO.

15. A display device comprising:
a terminal comprising a first conductive layer and a second conductive layer over a substrate;
a first insulating layer over the second conductive layer;
a second insulating layer over the first insulating layer;
an organic compound layer containing light emitting material over the second insulating layer; and
a transistor comprising a gate electrode;
wherein the second conductive layer comprises oxide conductive material,
wherein part of the second conductive layer is covered with the first insulating layer,
wherein the first insulating layer comprises an organic insulating layer,
wherein the second insulating layer is in direct contact with the organic compound layer containing light emitting material and the second conductive layer, and wherein the first conductive layer is formed from a same layer as the gate electrode.

16. The display device according to claim 15, wherein the substrate comprises an organic resin substrate.

17. The display device according to claim 15, wherein a length of the first conductive layer extended from an edge of the substrate is larger than a length of the second conductive layer extended from the edge of the substrate.

18. The display device according to claim 15, wherein the first insulating layer comprises a thermosetting material.

19. The display device according to claim 15, wherein the second insulating layer comprises an inorganic insulation material.

20. The display device according to claim 19, wherein the inorganic insulation material is selected from the group consisting of a silicon nitride, an aluminum nitride, and an aluminum oxynitride.

21. The display device according to claim 15, wherein the organic compound layer containing light emitting material comprises one or more layers.

22. The display device according to claim 15, wherein the oxide conductive material is ITO.

* * * * *

UNITED STATES PATENT AND TRADEMARK OFFICE
CERTIFICATE OF CORRECTION

PATENT NO.         : 8,174,029 B2
APPLICATION NO.    : 13/082104
DATED              : May 8, 2012
INVENTOR(S)        : Shunpei Yamazaki et al.

Page 1 of 1

It is certified that error appears in the above-identified patent and that said Letters Patent is hereby corrected as shown below:

Column 8, line 29, "alight emitting" should read "a light emitting"

Column 8, line 52, "TFT 304 are flawed" should read "TFT 304 are formed"

Column 9, line 37, "thickness of 0.5 to 2" should read "thickness of 0.5 to 2 μm"

Column 14, TABLE 2, "$SiH/NH_3/N_2/H_2$" should read "$SiH_4/NH_3/N_2/H_2$"

Column 21, line 19, "substrate an implanted" should read "substrate and implanted"

Column 23, lines 6-7, "layer, electrons injection" should read "layer, an electrons injection"

Column 23, line 47, "barrier layer 902" should read "barrier layer 402"

Column 27, line 4, "an example of FDA" should read "an example of PDA"

Signed and Sealed this
Eighteenth Day of December, 2012

David J. Kappos
*Director of the United States Patent and Trademark Office*